United States Patent
Almarfoie et al.

(10) Patent No.: US 12,438,499 B1
(45) Date of Patent: *Oct. 7, 2025

(54) PHOTOVOLTAIC ARRAY CLEANING SYSTEM

(71) Applicant: KING FAHD UNIVERSITY OF PETROLEUM AND MINERALS, Dhahran (SA)

(72) Inventors: Abdullah Saeed Almarfoie, Dhahran (SA); Abdullah Thagib Alshalan, Dhahran (SA); Fahad Abdulaziz Alsulaiman, Dhahran (SA); Amir Al-Ahmed, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 19/246,611

(22) Filed: Jun. 23, 2025

Related U.S. Application Data

(63) Continuation of application No. 18/622,623, filed on Mar. 29, 2024, now Pat. No. 12,355,397.

(30) Foreign Application Priority Data

Mar. 15, 2024 (SA) ................................ 1020241377

(51) Int. Cl.
 *H02S 40/10* (2014.01)
 *B08B 6/00* (2006.01)
(52) U.S. Cl.
 CPC ............... *H02S 40/10* (2014.12); *B08B 6/00* (2013.01)

(58) Field of Classification Search
 None
 See application file for complete search history.

(56) References Cited

U.S. PATENT DOCUMENTS

2022/0216826 A1  7/2022  Saha et al.
2024/0283399 A1* 8/2024  Kang ........................ B08B 1/12

FOREIGN PATENT DOCUMENTS

CN     201048359 Y     4/2008
CN     110883011 A     3/2020
(Continued)

OTHER PUBLICATIONS

Olorunfemi et al. ; Solar Panels Dirt Monitoring and Cleaning for Performance Improvement: A Systematic Review on Smart Systems ; MDPI sustainability 14 ; Sep. 1, 2022 ; 27 Pages.

*Primary Examiner* — Daniel P Malley, Jr.
(74) *Attorney, Agent, or Firm* — Oblon, McClelland, Maier &Neustadt, L.L.P.

(57) ABSTRACT

A cleaning system for a photovoltaic surface includes one or more of an electrostatic dust repellant, a vacuum device, and a compressed air spray device, powered by the photovoltaic array, and configured to function when the photovoltaic surface, including a photovoltaic array mounted on a base, is rotated from a first position with exposure to sunlight, to a second position, where the photovoltaic surface is almost parallel to the ground. The system includes a rotor to turn the base, and hence the photovoltaic surface, from first position to second position, rotating a front surface of the photovoltaic array by over 105 degrees. The cleaning device is housed in a half cylindrical box with an opening for exposure, and is positioned at an edge of the photovoltaic array when in its first position.

6 Claims, 14 Drawing Sheets

(56) References Cited

FOREIGN PATENT DOCUMENTS

| | | | |
|---|---|---|---|
| CN | 212252814 | U | 12/2020 |
| CN | 113839615 | A | 12/2021 |

* cited by examiner

PHOTOVOLTAIC ARRAY CLEANING SYSTEM

CROSS-REFERENCE TO RELATED APPLICATIONS

The present application is a Continuation of U.S. application Ser. No. 18/622,623, now allowed, having a filing date of Mar. 29, 2024.

CROSS REFERENCE TO RELATED APPLICATION

The present disclosure claims the benefit of Saudi Patent Application No. 1020241377 filed on Mar. 15, 2024, with the Saudi Authority for Intellectual Property Office, which is incorporated herein by reference in its entirety.

BACKGROUND

Technical Field

The present disclosure is directed to a cleaning system, specifically to a waterless cleaning system including one or more cleaning mechanisms for a photovoltaic (PV) system, with the cleaning system integrated into the photovoltaic (PV) system to enhance efficiency and longevity.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present invention.

Photovoltaic (PV) technology has become increasingly prevalent as a source of sustainable energy generation. The efficiency of photovoltaic (PV) panels in a photovoltaic (PV) system is an important factor in maximizing the energy output of the photovoltaic (PV) system. Photovoltaic (PV) panels are exposed to the natural environment, leading to accumulation of dust or debris on the surface of the photovoltaic panels. This can be a foremost problem especially in arid and semi-arid regions. These environments, characterized by their dry climate and dusty conditions, lead to a rapid build-up of a layer of dust on the photovoltaic (PV) panels. This layer acts as a barrier to sunlight, substantially diminishing the ability of the PV panels to convert solar energy into electrical energy. Consequently, the energy production of PV systems in such regions can experience a marked decrease, sometimes up to 10%. The dust layer can lead to a substantial drop in the efficiency of the photovoltaic panels and hence a drop in the energy production of the photovoltaic (PV) system. Maintaining regular and effective cleanliness of the surfaces of the photovoltaic (PV) panels is thus a primary need to maintain a required energy output.

In general, cleaning methods for photovoltaic (PV) panels are broadly categorized into natural and machine-assisted methods. Natural cleaning methods rely on environmental forces such as gravity, wind, rain, and snow to remove debris without human intervention. These methods are cost-effective and non-labor intensive but can be unreliable, depending on the weather and geographical location. Machine-assisted cleaning methods are more controllable, and may further be divided into manual and self-cleaning techniques.

Manual cleaning methods involve direct human effort, and may include air/water jet, mopping, scrubbing, vacuum, wiping, etc. Air or water jet cleaning efficiently dislodges dust but is unsustainable in arid regions due to high water usage. Mopping, a labor-intensive manual method, often falls short in removing more adherent dirt. Scrubbing can effectively remove dirt but risks scratching the panel surface, potentially impairing efficiency. Vacuum cleaning, while conserving water, may not effectively tackle stuck-on dirt and is less viable for large-scale applications. Wiping, similar to mopping, requires manual effort and may not provide thorough cleaning, especially for larger installations. On the other hand, self-cleaning methods may further be split into passive systems, such as hydrophobic or hydrophilic coatings that reduce dirt adherence. Passive cleaning methods offer low-maintenance solutions with varying degrees of effectiveness. Each cleaning method presents trade-offs between efficiency, cost, and practicality. In general, these traditional cleaning methods often involve manual labor and significant water usage, which are not always practical or sustainable.

Active cleaning methods, which may utilize mechanical, electrostatic, and robotic techniques, automatically remove debris from the panel surfaces, but in their existing form have some inherent limitations. For instance, US 20220216826A1 discloses a photovoltaic panel cleaning system including a storage tank for pressurized air, first and second linear actuators, a panel-cleaning device, with the pressurized air operating the actuators and cleaning device, and sensors to detect fluid and debris on the panels, with a programmable controller executing instructions for cleaning. However, the cleaning system does not include an approach utilizing an integration of electrostatic dust repellent technologies or a combination of vacuum and compressed air spray systems operating without water.

CN 110883011A presents an overturning cleaning method for photovoltaic products. The method involves using external power to drive motors that rotate a photovoltaic module for cleaning with fan blades. However, the cleaning system does not include an approach utilizing an integration of electrostatic dust repellent technologies or a combination of vacuum and compressed air spray systems operating without water.

CN113839615A discloses a self-cleaning photovoltaic panel with a dust removal function using a motor-driven dust sweeping device with bristles to clean the panel surface. However, the cleaning system does not include an approach utilizing an integration of electrostatic dust repellent technologies or a combination of vacuum and compressed air spray systems operating without water.

Accordingly, it is one object of the present disclosure to provide a solution for cleaning photovoltaic panels that overcomes the limitations of existing technologies, offering a system that is both effective in diverse environmental conditions and considerate of resource constraints. The present disclosure describes a cleaning system for photovoltaic panels of a photovoltaic system that utilizes one or more cleaning mechanisms involving different combinations of electrostatic dust repellent technologies, vacuum system, and compressed air spray system on an inclined photovoltaic panel during non-productive hours, thereby, improving the efficiency of the photovoltaic panels, in addition to increasing the energy production of the photovoltaic system.

SUMMARY

In an exemplary embodiment, a cleaning system for a photovoltaic surface is provided. The cleaning system comprises a photovoltaic array mounted on a top surface of a base. Herein, the photovoltaic array comprises a plurality of photovoltaic segments arranged in parallel. The cleaning system further comprises a rotor arranged along a central axis of a bottom surface of the base such that the rotor is aligned with a central axis of each photovoltaic segment of the plurality of photovoltaic segments. Herein, the rotor is configured to turn the base between a first position and a second position. In the second position, a front surface of the photovoltaic array is at an angle of at least 105 degrees from the first position. The cleaning system further comprises a motor configured to drive the rotor. The cleaning system further comprises a support structure comprising a set of supporting legs, wherein the base is mounted on the support structure. The cleaning system further comprises a cleaning unit configured to remove particles from the front surface of the photovoltaic array. The cleaning unit comprises an upper track, a lower track, and a cleaning device. Herein, the upper track is parallel to a top edge of the photovoltaic array, the lower track is parallel to a bottom edge of the photovoltaic array, and both the upper track and the lower track are coplanar with the photovoltaic array. Further, herein, the cleaning device has a top end and a bottom end, the top end connected to the upper track and the bottom end connected to the lower track. Further, herein, the cleaning device is encased in a half cylindrical box with an opening configured to expose the cleaning device. In the first position of the photovoltaic array, the cleaning device is positioned in at least one of a first edge and a second edge of the photovoltaic array. The cleaning device is one or more devices selected from the group consisting of an electrostatic device comprising an electrostatic dust repellant, in which the electrostatic dust repellant is configured to generate an electrostatic force to loosen particles on the front surface of the photovoltaic array; a vacuum device configured to suck particles on the front surface of the photovoltaic array; and a compressed air spray device configured to blow particles on the front surface of the photovoltaic array. The cleaning unit is further configured to function when the photovoltaic array is in the second position. The photovoltaic array is configured to supply power to the vacuum device and the compressed air spray device.

In some embodiments, the electrostatic dust repellant of the electrostatic device comprises an electrode with an opposite polarity as that of the front surface of the photovoltaic array.

In some embodiments, the electrode has a top end connected to the upper track and a bottom end connected to the lower track of the cleaning unit.

In some embodiments, the electrode is configured to move across a breadth of a front surface of each of the plurality of photovoltaic segments.

In some embodiments, the electrostatic force is generated between the front surface of the photovoltaic array and the electrode.

In some embodiments, the vacuum device comprises a vacuum generator with a top end connected to the upper track and a bottom end connected to the lower track of the cleaning unit.

In some embodiments, the vacuum device is configured to move across a breadth of a front surface of each of the plurality of photovoltaic segments.

In some embodiments, the compressed air spray device comprises a blower with a top end connected to the upper track and a bottom end connected to the lower track of the cleaning unit.

In some embodiments, the blower of the compressed air spray device is configured to move across a breadth of a front surface of each of the plurality of photovoltaic segments.

In some embodiments, the cleaning device comprises the vacuum device coupled to the electrostatic device.

In some embodiments, the electrostatic device is configured to loosen particles from the front surface of the photovoltaic array and the vacuum device is configured to suck the loosened particles.

In some embodiments, the cleaning device comprises the compressed air spray device coupled to the electrostatic device.

In some embodiments, the electrostatic device is configured to loosen particles from the front surface of the photovoltaic array and the compressed air spray device is configured to blow the loosened particles off the front surface of the photovoltaic array.

In some embodiments, the cleaning device comprises the compressed air spray device coupled to the vacuum device.

In some embodiments, a blower of the compressed air spray device is configured to blow particles off the front surface of the photovoltaic array and the vacuum device is configured to suck the particles from the front surface of the photovoltaic array.

In some embodiments, the cleaning device comprises the compressed air spray device and the vacuum device coupled to the electrostatic device.

In some embodiments, the rotor is configured to turn the photovoltaic array about the central axis of the bottom surface of the base.

In some embodiments, a first end of each of the set of supporting legs of the support structure is connected to the central axis of the bottom surface of the base.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
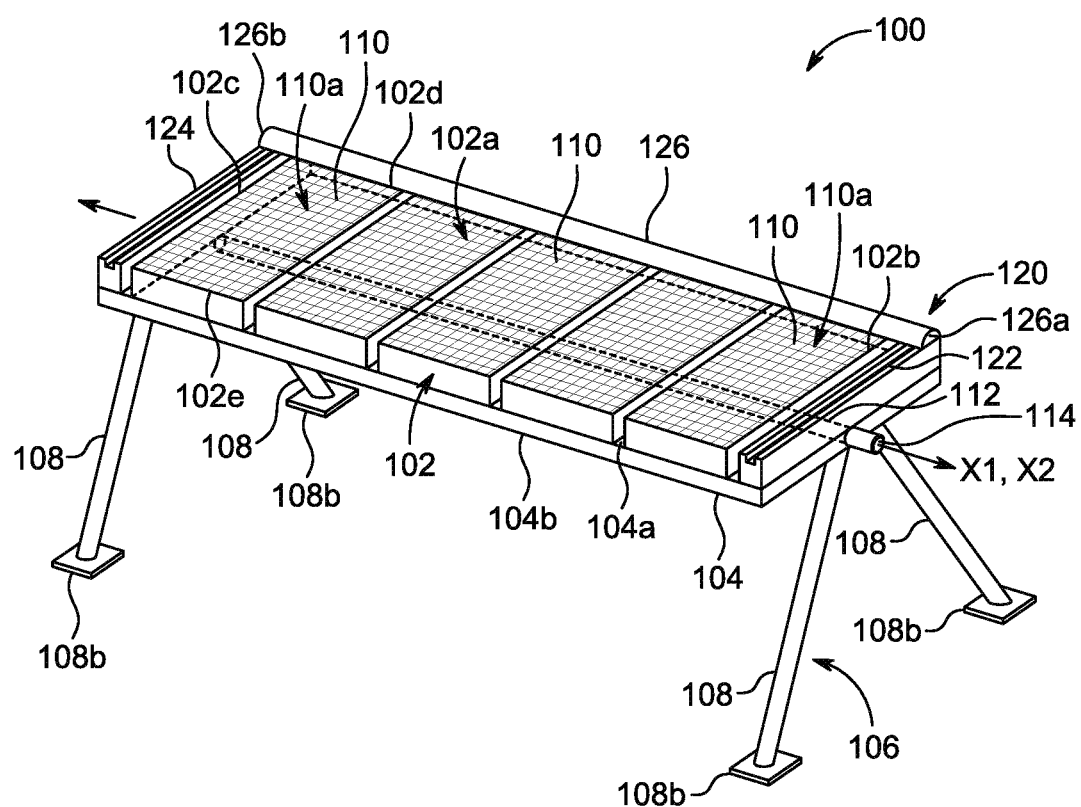
FIG. 1 is an exemplary perspective view diagram of a cleaning system, according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of the present disclosure are directed to a cleaning system for photovoltaic (PV) arrays, addressing a problem of dust accumulation on the surfaces of a plurality of photovoltaic panel of the photovoltaic arrays, which contributes to reduction of their efficiency. The present disclosure involves a rotation mechanism for the panels of the photovoltaic (PV) arrays for rotating the panels of photovoltaic (PV) arrays, so that the active surface of the panels of photovoltaic (PV) arrays are inclined to face the ground during non-productive hours. Firstly, gravity contributes to remove larger dust particles on the surface of the photovoltaic arrays. The present disclosure integrates an array of cleaning mechanisms, each using various combinations of electrostatic dust repellent, vacuum, and compressed air spray techniques. These cleaning mechanisms operate when the active surface of the photovoltaic array is facing downwards, removing dust without water. The present disclosure aims to increase cleaning efficiency, reduce resource consumption including water usage, and maintain effectiveness of the photovoltaic array for an increased energy production.

Referring to FIG. 1, illustrated is a diagrammatic view of a cleaning system, as represented by reference numeral 100, of the present disclosure. The cleaning system 100 is implemented for a photovoltaic surface. In general, the cleaning system 100 integrates into a structural framework of a photovoltaic installation for cleaning of the photovoltaic surface therein. For purposes of the present disclosure, the cleaning system 100 is defined to include a photovoltaic array 102. It may be appreciated that, in alternative configurations, the cleaning system 100 may be adapted as a retrofittable system to be installed with any standard photovoltaic array without departing from the spirit and the scope of the present disclosure. The cleaning system 100 of the present disclosure is adapted to function without hindering solar absorption capabilities of the photovoltaic surface of the photovoltaic array 102 of a photovoltaic installation, and is implemented for cleaning of the photovoltaic surface of the photovoltaic array 102 and thereby for maintaining efficiency of the photovoltaic installation. The cleaning system 100, in general, is designed to be integrated with a structure of the photovoltaic installation, maintaining the aesthetics and functionality of the photovoltaic installation.

As shown in FIG. 1, the photovoltaic array 102 has a front surface 102a. The front surface 102a of the photovoltaic array 102 defines the photovoltaic surface (as discussed) as per the present disclosure. As illustrated in FIG. 1, in combination with FIGS. 2A and 2B, the cleaning system 100 also includes a base 104. The base 104 is in the form of a planar structure with a top surface 104a and a bottom surface 104b. The photovoltaic array 102 is mounted on the top surface 104a of the base 104. The bottom surface 104b of the base 104 has a central axis 'X1' which defines an axis about which the photovoltaic array 102 is rotated (as discussed later in the description).

The cleaning system 100 further includes a support structure 106. The support structure 106 includes a set of supporting legs 108. The base 104 is mounted on the support structure 106. The supporting legs 108, integral to the support structure 106, are designed to elevate the base 104, and thereby ensure that the photovoltaic array 102 is preferably positioned for maximum sunlight exposure and accessibility for cleaning means of the cleaning system 100 (as discussed later in the proceeding paragraphs). The set of supporting legs 108 may include 2, 4, 6 or even up to 10 supporting legs, depending on the length of the photovoltaic array 102 along the larger edge and/or the length of the base 104. The set of supporting legs are located at the two ends of the larger edge of the base 104 and/or between the two ends of the larger edge of the base 104. In an example, with the set of supporting legs 108 including two supporting legs, the two supporting legs may be located at a central point of the base 104 of the photovoltaic array 102. In an example, with the set of supporting legs 108 including six or more supporting legs, two supporting legs may be located towards one end of the larger edge of the base 104, two supporting legs may be located towards the other end of the larger edge of the base 104, and two or more supporting legs may be located between the two ends of the larger edge of the base 104. In FIG. 1, the set of supporting legs of the base 104 of the photovoltaic array 102 includes four supporting legs, i.e., two pairs of supporting legs (hereafter, commonly referred to as set of supporting legs 108), with each pair located at an end of the larger edge of the base 104 of the photovoltaic array 102. As illustrated, each of the set of supporting legs 108 has a first end 108a and a second end 108b. Herein, the first end 108a of each of the set of supporting legs 108 of the support structure 106 is connected to the central axis 'X1' of the bottom surface 104b of the base 104. Further, the second end 108b of each of the set of supporting legs 108 is firmly placed on the ground, to enable the support structure to 106 to support entirety of the cleaning system 100.

Further, as illustrated in FIG. 1, the photovoltaic array 102 includes a plurality of photovoltaic segments 110. Herein, each of the plurality of photovoltaic segments 110 are individual solar cells or panels arranged to form the photovoltaic array 102, working collectively to convert solar energy into electrical energy. Each of the plurality of photovoltaic segments 110 has a front surface 110a (in the same direction as the front surface 102a of the photovoltaic array 102) with the front surfaces 110a of the plurality of photovoltaic segments 110 together defining the front surface 102a of the photovoltaic array 102. In the present configuration, the plurality of photovoltaic segments 110 are arranged in parallel, such that the larger edge of each of the photovoltaic segment of the plurality of photovoltaic segments 110 are aligned next to each other. Specifically, the plurality of photovoltaic segments 110 are arranged such that a central axis 'X2' of each photovoltaic segment of the plurality of photovoltaic segments 110 are inline to each other. This configuration allows for maximizing the solar collection efficiency with minimum and sturdy footprint, as the parallel placement of the plurality of photovoltaic segments 110 ensures an expansive, uniform surface area for sunlight absorption. This configuration also provides a non-obtrusive design, allowing for the potential inclusion of additional components of the cleaning system 100. The cleaning system 100 of the present disclosure is also equally applicable to any other configuration of the plurality of photovoltaic segments 110 without losing the scope and spirit of the present disclosure, for example, the plurality of photovoltaic segments 110 arranged with the shorter edge of each of the photovoltaic segment aligned next to each other.

The cleaning system 100 further includes a rotor 112. The rotor 112 is arranged along the central axis 'X1' of the bottom surface 104b of the base 104 such that the rotor 112 is aligned with the central axis 'X2' of each photovoltaic segment of the plurality of photovoltaic segments 110. Herein, the cleaning system 100 also includes a motor 114 configured to drive the rotor 112. The rotor 112, in turn, is configured to turn (rotate/pivot) the base 104. Specifically, the rotor 112 is configured to turn the base 104 between a first position and a second position. In some examples, as illustrated, the rotor 112 may be in the form of a shaft or the like, connected to the motor 114 and extending along the central axis 'X1' of the bottom surface 104b of the base 104, inline to the central axis 'X2' of each photovoltaic segment of the plurality of photovoltaic segments 110, to turn the base 104 and the plurality of photovoltaic segments 110 upon rotation thereof. In an example, the rotor 112 may have an elongated cylindrical structure for a smooth rotation of the base 104 along the central axis 'X1'.

Figure 2A:
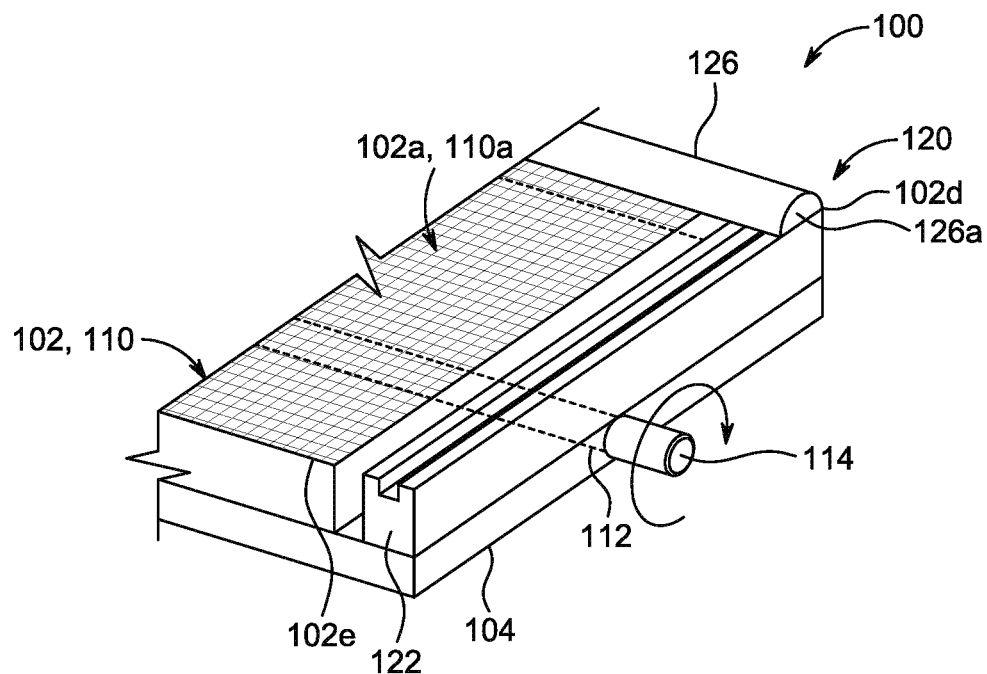
FIG. 2A is an exemplary partial top perspective diagram of the cleaning system depicting a base therein at a first position thereof, with a cleaning unit of the cleaning system positioned in one of the edges of a photovoltaic array, according to certain embodiments.
Figure 2B:
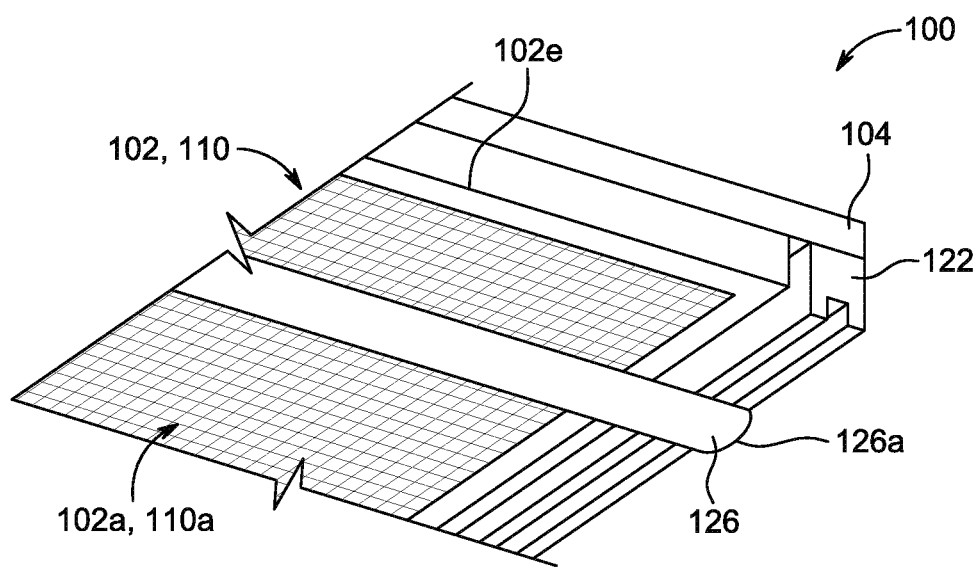
FIG. 2B is an exemplary partial bottom perspective diagram of the cleaning system depicting the base therein at a second position thereof, with the cleaning unit of the cleaning system in operation on a front surface of the photovoltaic array, according to certain embodiments.

Herein, in the first position (as depicted in FIG. 2A), the front surface 102a of the photovoltaic array 102 faces upwards for regular solar power generation. Generally, in the first position, the front surface 102a of the photovoltaic array 102 is at an angle of up to (or, in some cases, even more than) 45 degrees relative to the ground, for example an angle of 5-45°, 10-40°, 15-35°, or 20-30° relative to the horizontal ground surface. Further, in the second position (as depicted in FIG. 2B), the front surface 102a of the photovoltaic array 102 is at an angle of at least 105 degrees from the first position, preferably from 105-180°, 115-170°, 125-160°, or 135-150°, from the first position. It may be appreciated that with the turning of the front surface 102a of the photovoltaic array 102 by another 105 degrees (or other amount as noted above), with the initial first position being at approximately 45 degrees, the front surface 102a of the photovoltaic array 102 may effectively be facing downwards (towards the ground) in the second position. This orientation allows for gravity to take effect to remove large dust particles and for further efficient cleaning of the front surface 102a of the photovoltaic array 102 (i.e., the photovoltaic surface) using various cleaning means of the cleaning system 100 (as discussed in the proceeding paragraphs).

In the cleaning system 100, the rotor 112 is configured to turn the photovoltaic array 102 about the central axis 'X1' of the bottom surface 104b of the base 104. This rotation provides for dual functionality, i.e., for energy capture and self-cleaning, for the cleaning system 100. When the rotor 112 turns the photovoltaic array 102 from the first position, where the photovoltaic segments 110 face the sun for maximum energy absorption, to the second position, here the photovoltaic segments 110 are inverted for effective cleaning. This inversion positions the photovoltaic array 102 effectively to allow for gravity to aid in the removal of larger dust particles. Herein, the rotor 112 and the motor 114 are adapted for smooth and precise rotation, minimizing stress on the structure while enabling the photovoltaic array 102 to alternate between the first position and the second position. Such configuration and connections for the rotor 112 and the motor 114 for present purposes may be contemplated by a person skilled in the art, and thus not described herein for brevity of the present disclosure. This mechanism, along with other arrangements of the cleaning system 100 (as discussed hereinafter) helps in maintaining the efficiency and longevity of the photovoltaic array 102, by keeping it clean without the need for excessive manual intervention or the use of water, which is especially beneficial in arid environments.

The cleaning system 100 further includes a cleaning unit 120. The cleaning unit 120 is configured to remove particles from the front surface 102a of the photovoltaic array 102. In the present disclosure, the cleaning system 100 has been defined to include the photovoltaic array 102 and the cleaning unit 120; however, in some embodiments, the cleaning system 100 may be a retrofittable system to be installed with the photovoltaic array 102, and implement the cleaning unit 120 for removing particles from the front surface 102a of the photovoltaic array 102 (as also previously discussed). The cleaning unit 120 is an integral part of the cleaning system 100, designed to maintain the efficiency and longevity of the photovoltaic array 102 by removing dust particles from the front surface 102a thereof. The cleaning unit 120 is designed to be versatile and effective in various environmental conditions, especially in areas where water resources are scarce, or conservation is a priority.

As illustrated in FIG. 1, in conjunction with FIGS. 2A-2B, the cleaning unit 120 includes an upper track 122, a lower track 124, and a cleaning device 126. Herein, the cleaning device 126 is in the form of a member extending between and configured to move along the upper track 122 and the lower track 124. As shown, the upper track 122 is parallel to a top edge 102b (a first edge of the two smaller edges of the photovoltaic array 102) of the photovoltaic array 102. Similarly, the lower track 124 is parallel to a bottom edge 102c (a second edge of the two smaller edges of the photovoltaic array 102) of the photovoltaic array 102. Herein, the lower track 124 may mirror the design and function of the upper track 122. In the exemplary illustrations, the upper track 122 and the lower track 124 are depicted as 'U' shaped channels; however, in other examples, the upper track 122 and the lower track 124 may be implemented in some other form to allow for traversal (sliding) of the cleaning device 126 along thereof. Further, as shown, the cleaning device 126 has a top end 126a and a bottom end 126b. The top end 126a of the cleaning device 126 is connected to the upper track 122, and the bottom end 126b of the cleaning device 126 is connected to the lower track 124. Herein, both the upper track 122 and the lower track 124 are coplanar with the photovoltaic array 102. The coplanar alignment of both the upper track 122 and the lower track 124 with the photovoltaic array 102 ensures that the cleaning device 126 maintains constant contact with the front surface 102a of the photovoltaic array 102 throughout the cleaning process. This design disposes the cleaning device 126 to extend between the upper track 122 and the lower track 124, and this, with the strategic positioning of the upper track 122 and the lower track 124, facilitate the traversal (sliding) of the cleaning device 126, traversing up and down the photovoltaic array 102, and ensuring full coverage of the front surface 102a of the photovoltaic array 102 during the cleaning operation. It may be contemplated that the cleaning unit 120 may also include a drive mechanism (not shown), including a motor, to facilitate the up and down traversal of the cleaning device 126 along the upper track 122 and the lower track 124. In some examples, this drive mechanism for the cleaning unit 120 may derive its power from the motor 114, using some connection arrangement, such as gears or shaft, without any limitations.

Figure 3:
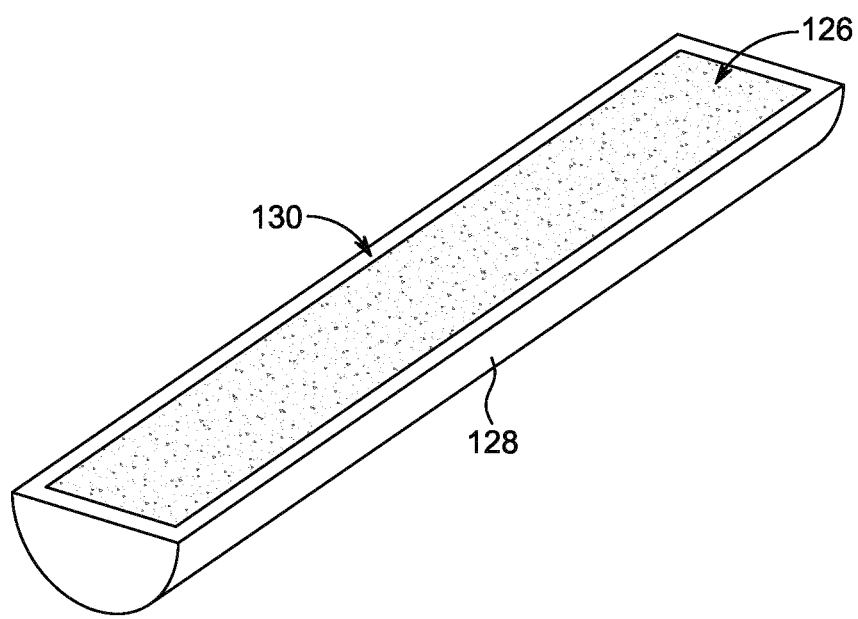
FIG. 3 is an exemplary perspective view diagram of a cleaning device of the cleaning system, according to certain embodiments.

Referring to FIG. 3, illustrated is an exemplary diagrammatic view of the cleaning device 126. As shown, the cleaning device 126 is generally in the form of an extended member. The cleaning device 126 is equipped with mechanisms suitable for removing dust and debris from the front surface 102a of the photovoltaic array 102, ensuring they remain clean and efficient. In the present embodiments, the cleaning device 126 is encased in a half cylindrical box 128 with an opening 130 configured to expose the cleaning device 126. In an example, the cleaning device 126 may be encased in other variations of the half cylindrical box 128, such as, half rectangular box 128, a half circular box 128 or a half conical box 128. The half cylindrical box 128 or any of its variations, shields the cleaning device 126 within, from external elements and potential damage during operation or when not in use. Further, such design of the half cylindrical box 128 with the opening 130 to expose the cleaning device 126, optimizes movement and accessibility of the cleaning device 126 by direct contact to the front surface 102a of the photovoltaic array 102, allowing for effective cleaning. The opening 130 may be designed such that it allows the cleaning device 126 to have direct contact with only the front surface 102a of the photovoltaic array 102, while preventing any part of the cleaning mechanism from making unnecessary or harmful contact with other sensitive surfaces of the photovoltaic array 102.

As depicted in FIG. 2A, in the first position of the photovoltaic array 102, the cleaning device 126 is positioned in at least one of a first edge 102d and a second edge 102e of the photovoltaic array 102. Such placement is implemented when the cleaning device 126, or the cleaning unit 120 as a whole, is not operational. Such placement may further be implemented as a starting position for initiating the cleaning process, so that the cleaning device 126 may cover the entirety of the front surface 102a of the photovoltaic array 102 (when operational). Further, as depicted in FIG. 2B, the cleaning unit 120, as a whole, is further configured to function when the photovoltaic array 102 is in the second position. That is, the cleaning unit 120 may start its operations with the cleaning device 126 starting to slide along the upper track 122 and the lower track 124 of the cleaning unit 120, when the photovoltaic array 102 is in the second position. This ensures that larger dust particles may already be removed from the front surface 102a of the photovoltaic array 102 (due to effect of gravity in the second position), and then the cleaning unit 120 may further be implemented for comprehensive cleaning, ensuring that entirety of the front surface 102a of the photovoltaic array 102 is cleaned efficiently and thoroughly.

As mentioned, the cleaning device 126 is equipped with mechanisms suitable for removing dust and debris from the front surface 102a of the photovoltaic array 102, ensuring they remain clean and efficient. In the cleaning system 100, the cleaning device 126 may be implemented as a customizable assembly capable of employing various types of cleaning mechanisms. In present embodiments, the cleaning device 126 is one or more devices selected from the group consisting of an electrostatic device, a vacuum device, and a compressed air spray device. These different cleaning mechanisms are selected based on their effectiveness in removing different types of debris and dust from the photovoltaic array 102. Each type of cleaning mechanism has its unique method of operation, offering a range of cleaning capabilities. The flexibility in choosing one of the appropriate cleaning mechanism or different combinations thereof allows the cleaning system 100 to be tailored to the specific environmental conditions and types of dirt or debris encountered, ensuring efficient and thorough cleaning of the photovoltaic array 102.

Figure 4A:
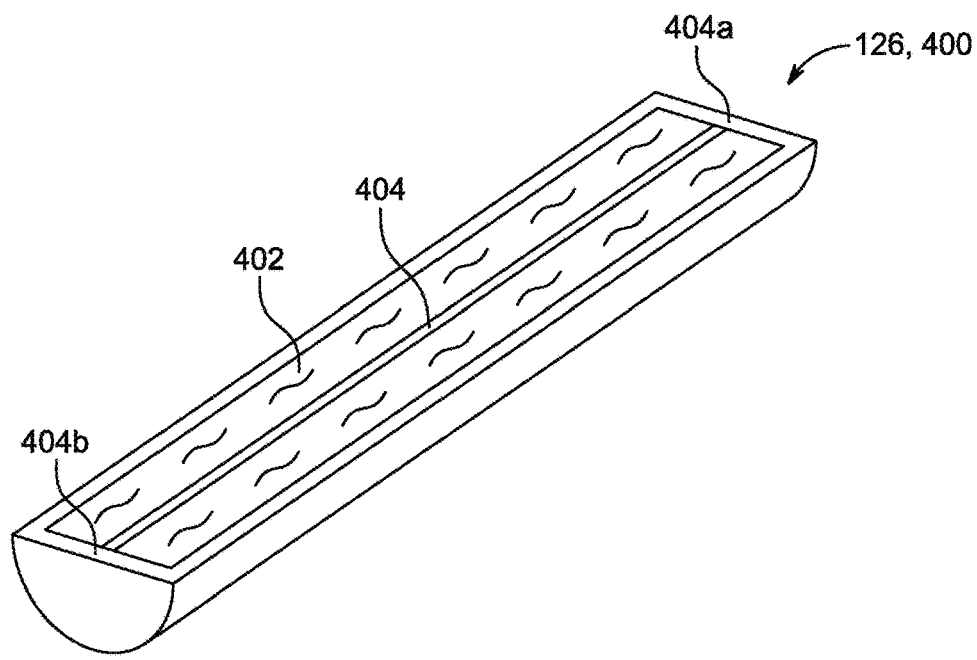
FIG. 4A is an exemplary perspective view diagram of the cleaning device adapted as an electrostatic device, according to certain embodiments.

Referring to FIG. 4A, illustrated is a diagrammatic view of the cleaning device 126 adapted as the electrostatic device (as represented by reference numeral 400). Herein, the electrostatic device 400 includes an electrostatic dust repellant 402. The electrostatic dust repellant 402 is configured to generate an electrostatic force to loosen particles on the front surface 102a of the photovoltaic array 102. Specifically, the electrostatic dust repellant 402 of the electrostatic device 400 includes an electrode 404 with an opposite polarity as that of the front surface 102a of the photovoltaic array 102. The electrostatic force is generated between the front surface 102a of the photovoltaic array 102 and the electrode 404. It may be appreciated that this mechanism involves the principle of electrostatic attraction and repulsion. The particles of dust on the front surface 102a of the photovoltaic array 102 typically acquire a charge due to environmental factors. When the electrode 404, carrying an opposite charge, is brought near the front surface 102a, it creates the electrostatic field. This electrostatic field induces a force on the charged dust particles, causing them to repel from the front surface 102*a* due to the principle of opposite charges attracting and like charges repelling. This loosening of dust particles facilitates their easier removal by the electrostatic device 400. The electrostatic device 400, as the cleaning device 126, is particularly effective in dry environments where dust and debris are common challenges.

Figure 4B:
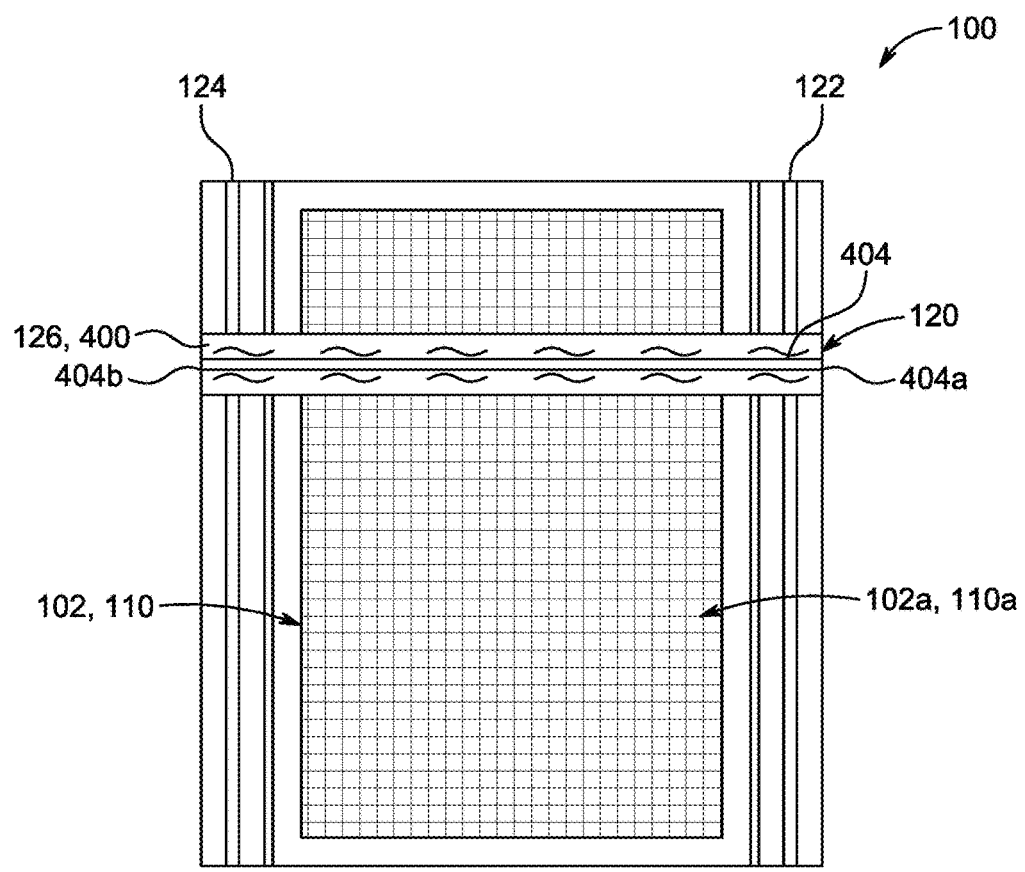
FIG. 4B is an exemplary bottom planar diagram of the cleaning unit of FIG. 4A in operation on the front surface of the photovoltaic array, according to certain embodiments.

As described, and shown in FIG. 2A, the top end 126*a* of the cleaning device 126 is connected to the upper track 122 and the bottom end 126*b* of the cleaning device 126 is connected to the lower track 124. Referring to FIG. 4B, as illustrated, the electrostatic device 400, as the cleaning device 126, with the electrode 404 has a top end 404*a* connected to the upper track 122 and a bottom end 404*b* connected to the lower track 124 of the cleaning unit 120. This design disposes the electrode 404 to extend between the upper track 122 and the lower track 124; and with the strategic positioning of the upper track 122 and the lower track 124, the electrode 404 is configured to move across a breadth of the front surface 110*a* of each of the plurality of photovoltaic segments 110. In other words, such configuration facilitates the traversal of the electrode 404, traversing up and down the photovoltaic array 102, and ensuring full coverage of the front surface 102*a* of the photovoltaic array 102 for inducing the electrostatic force during the cleaning operation.

Figure 5A:
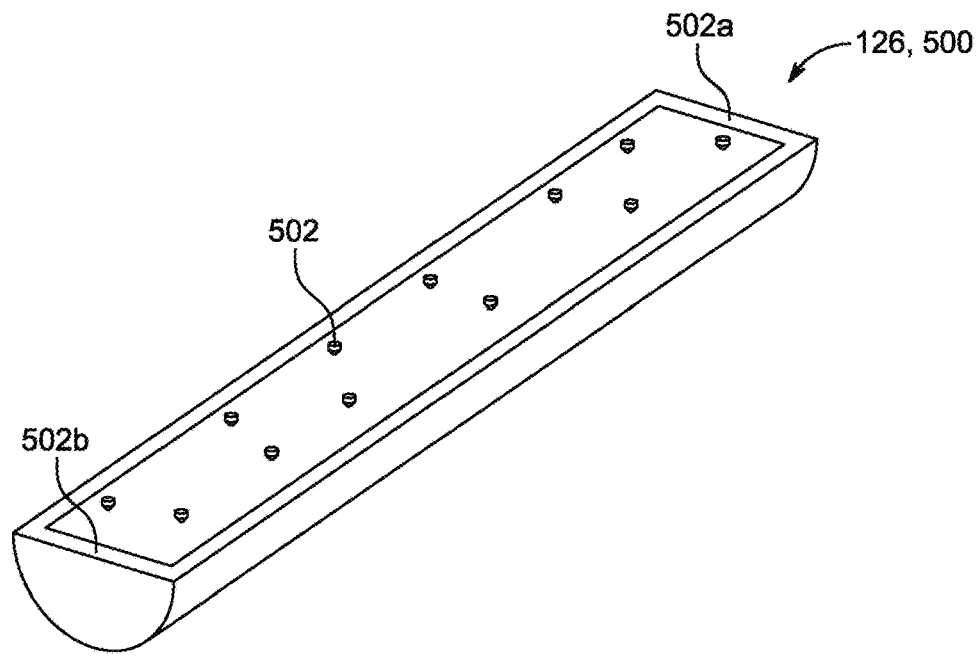
FIG. 5A is an exemplary perspective view diagram of the cleaning device adapted as a vacuum device, according to certain embodiments.

Referring to FIGS. 5A, illustrated is a diagrammatic view of the cleaning device 126 adapted as the vacuum device (as represented by reference numeral 500). Herein, the vacuum device 500 is configured to suck particles on the front surface 102*a* of the photovoltaic array 102. Specifically, the vacuum device 500 includes a vacuum generator 502. In the present illustrations, the vacuum generator 502 has been depicted as multiple suction nozzles which may be in fluid communication with a vacuum source (like a pump or a fan, not shown), possibly built inside the vacuum device 500. The vacuum generator 502 operates on the principle of creating a low-pressure area in comparison to the ambient atmospheric pressure. This difference in pressure causes air, along with any loose particles on the front surface 102*a* of the photovoltaic array 102, to be drawn into the vacuum device 500. The mechanism typically involves the vacuum source that displaces air from a contained area, thereby creating a partial vacuum. When the vacuum device 500 is brought close to the front surface 102*a* of the photovoltaic array 102, the air pressure difference causes dust and other particulates to be sucked away from the front surface 102*a* and into the vacuum device 500. This method of particle removal is highly effective and does not require direct physical contact with the front surface 102*a*, minimizing the risk of scratching or other forms of damage to the photovoltaic array 102.

Figure 5B:
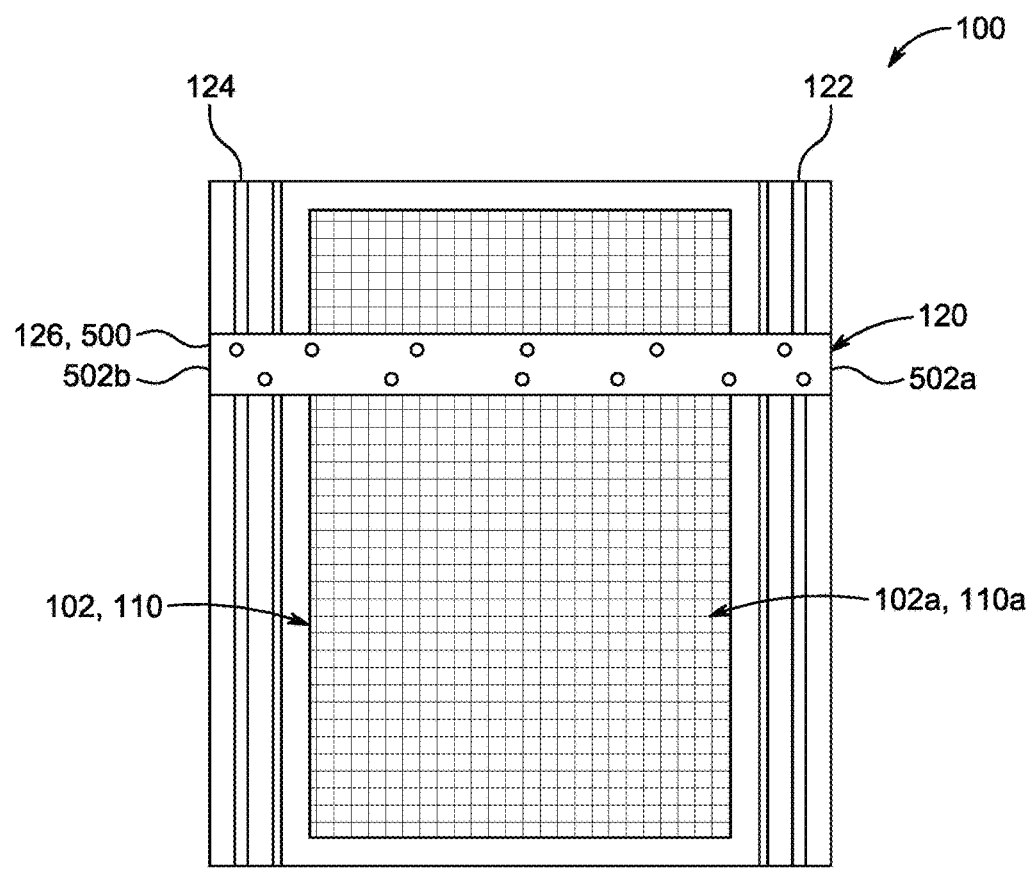
FIG. 5B is an exemplary bottom planar diagram of the cleaning unit of FIG. 5A in operation on the front surface of the photovoltaic array, according to certain embodiments.

Referring to FIG. 5B, as illustrated, the vacuum device 500, as the cleaning device 126, has the vacuum generator 502 with a top end 502*a* connected to the upper track 122 and a bottom end 502*b* connected to the lower track 124 of the cleaning unit 120. This design disposes the vacuum generator 502 to extend between the upper track 122 and the lower track 124; and with the strategic positioning of the upper track 122 and the lower track 124, the vacuum generator 502 is configured to move across the breadth of the front surface 110*a* of each of the plurality of photovoltaic segments 110. In other words, such configuration facilitates the traversal of the vacuum generator 502, traversing up and down the photovoltaic array 102, and ensuring full coverage of the front surface 102*a* of the photovoltaic array 102 for sucking particles therefrom during the cleaning operation.

Figure 6A:
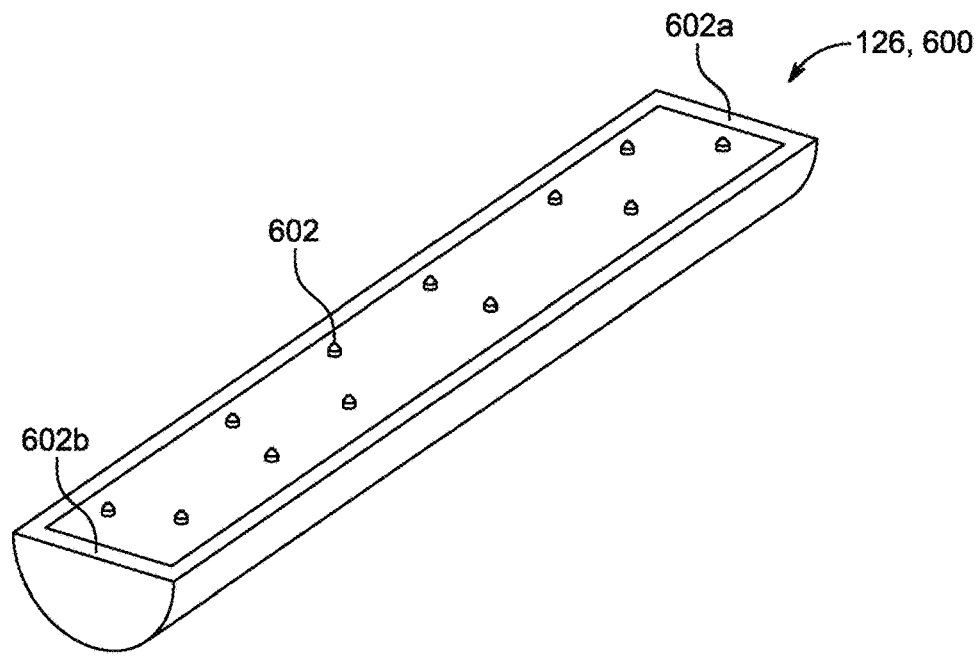
FIG. 6A is an exemplary perspective view diagram of the cleaning device adapted as a compressed air spray device, according to certain embodiments.

Referring to FIGS. 6A, illustrated is a diagrammatic view of the cleaning device 126 adapted as the compressed air spray device (as represented by reference numeral 600). Herein, the compressed air spray device 600 is configured to blow particles on the front surface 102*a* of the photovoltaic array 102. The compressed air spray device 600 effectively utilizes the force of compressed air to dislodge and clear debris and dust from the front surface 102*a* of the photovoltaic array 102. Herein, as shown, the compressed air spray device 600 includes a blower 602, represented as a plurality of nozzles. The compressed air spray device 600 may generate and direct a high-velocity stream of air onto the front surface 102*a* of the photovoltaic array 102. The compressed air spray device 600 typically involves a compressor (not shown) that pressurizes air in a storage tank (also not shown). When released through the nozzles of the blower 602, this pressurized air exits with significant force. This stream of air creates a shear force upon contact with the front surface 102*a*, which is effective in dislodging particles that are adhered thereto. The use of compressed air allows for cleaning without physical contact with the photovoltaic array 102, minimizing the risk of mechanical wear or damage. Each nozzle of the plurality of nozzles of the blower 602 may be a focused-airflow nozzle, focusing on the area of the front surface 102*a* of the photovoltaic array 102. In an example, the nozzle may have a wide opening to distribute compressed air on a wider are of the front surface 102*a* of the photovoltaic array 102. The nozzle may have flat-spray, a hollow-cone, a full-cone, a circular or a cylindrical shape. Depending on a required spray angle between the blower 602 and the front surface 102*a* of the photovoltaic array 102, an adequate nozzle length-to-diameter ratio is selected for the plurality of nozzles.

Figure 6B:
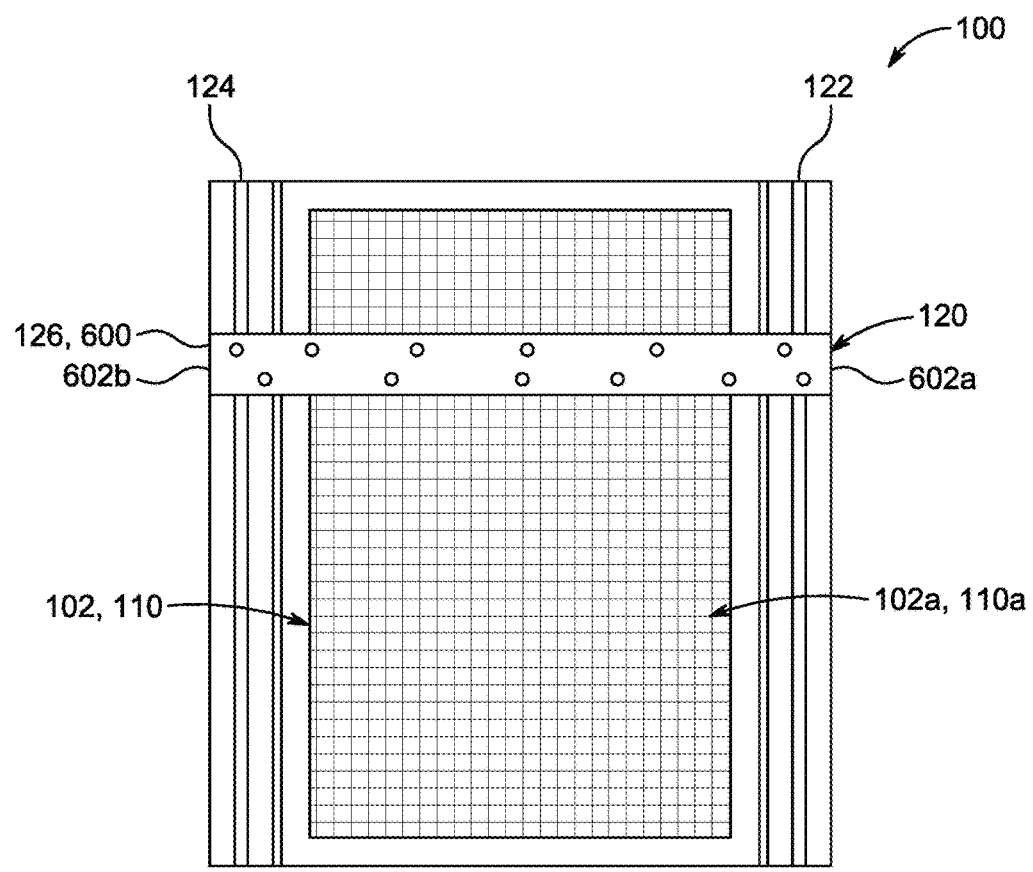
FIG. 6B is an exemplary bottom planar diagram of the cleaning unit of FIG. 6A in operation on the front surface of the photovoltaic array, according to certain embodiments.

Referring to FIG. 6B, as illustrated, the compressed air spray device 600, as the cleaning device 126, with the blower 602 has a top end 602*a* connected to the upper track 122 and a bottom end 602*b* connected to the lower track 124 of the cleaning unit 120. This design disposes the blower 602 to extend between the upper track 122 and the lower track 124; and with the strategic positioning of the upper track 122 and the lower track 124, the blower 602 of the compressed air spray device 600 is configured to move across the breadth of the front surface 110*a* of each of the plurality of photovoltaic segments 110. In other words, such configuration facilitates the traversal of the blower 602 of the compressed air spray device 600, traversing up and down the photovoltaic array 102, and ensuring full coverage of the front surface 102*a* of the photovoltaic array 102 for blowing particles away during the cleaning operation.

Figure 7A:
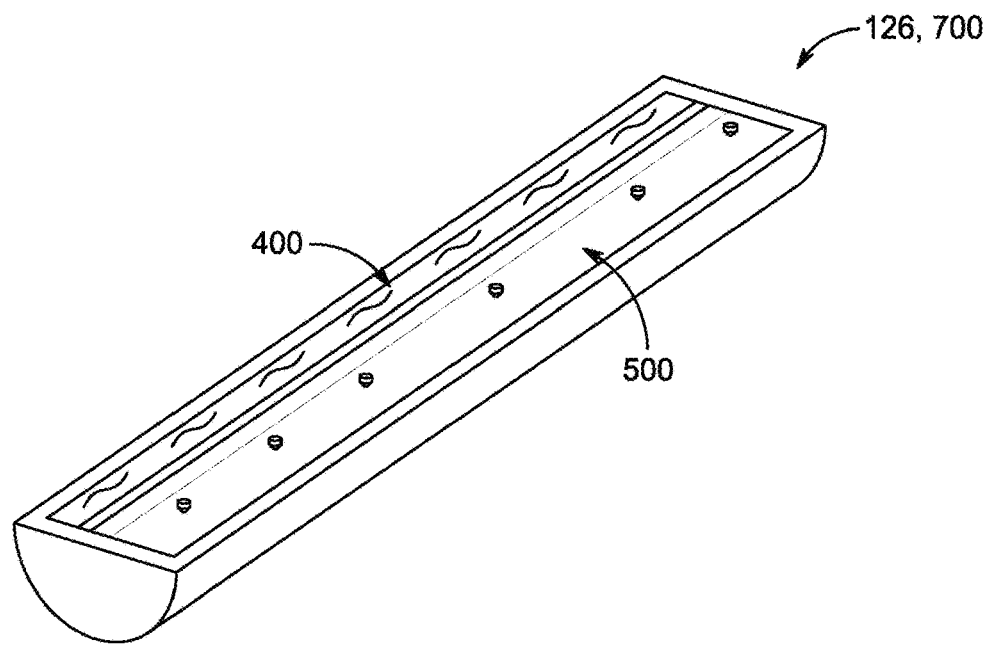
FIG. 7A is an exemplary perspective view diagram of the cleaning device adapted as the vacuum device coupled to the electrostatic device, according to certain embodiments.
Figure 7B:
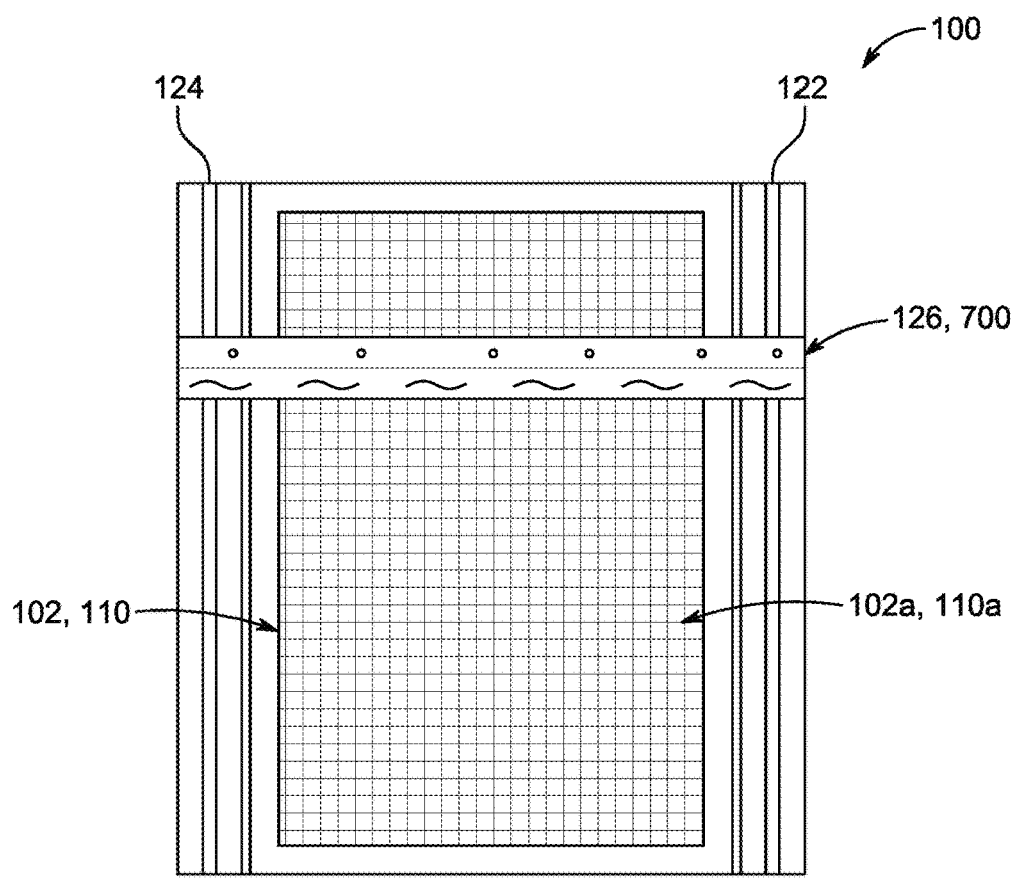
FIG. 7B is an exemplary bottom planar diagram of the cleaning unit of FIG. 7A in operation on the front surface of the photovoltaic array, according to certain embodiments.

In an embodiment, as illustrated in FIG. 7A, the cleaning device 126 is adapted as a cleaning device 700 including the vacuum device 500 coupled to the electrostatic device 400. This integration of the vacuum device 500 with the electrostatic device 400 makes the cleaning device 700 highly effective for cleaning of the photovoltaic array 102. As illustrated in FIG. 7B, the cleaning device 700, integrating the vacuum device 500 and the electrostatic device 400, is connected to the upper track 122 and the lower track 124 of the cleaning unit 120, and configured to move across the breadth of the front surface 110*a* of each of the plurality of photovoltaic segments 110. Herein, the electrostatic device 400 is configured to loosen particles from the front surface 102*a* of the photovoltaic array 102 and the vacuum device 500 is configured to suck the loosened particles. The electrostatic device 400, as part of this integrated system, achieves this loosening of particles through the generation of the electrostatic force, as previously described. The electrostatic force repels dust and debris particles away from the front surface 102a of the photovoltaic array 102, effectively loosening them without the need for physical contact. Once the particles are loosened by the electrostatic device 400, the vacuum device 500 sucks up these loosened particles, removing them from the front surface 102a of the photovoltaic array 102. The vacuum device 500 creates a low-pressure zone that draws in the loosened particles, ensuring that the particles do not settle back onto the photovoltaic array 102. This integration of the vacuum device 500 with the electrostatic device 400 results in an efficient two-step cleaning operation to enhance the cleaning efficiency, ensuring that the photovoltaic array 102 is not only freed from stuck dust particles but also that these particles are effectively removed therefrom, thereby, preferably, maintaining the functioning and maximum energy efficiency of the photovoltaic array 102.

Figure 8A:
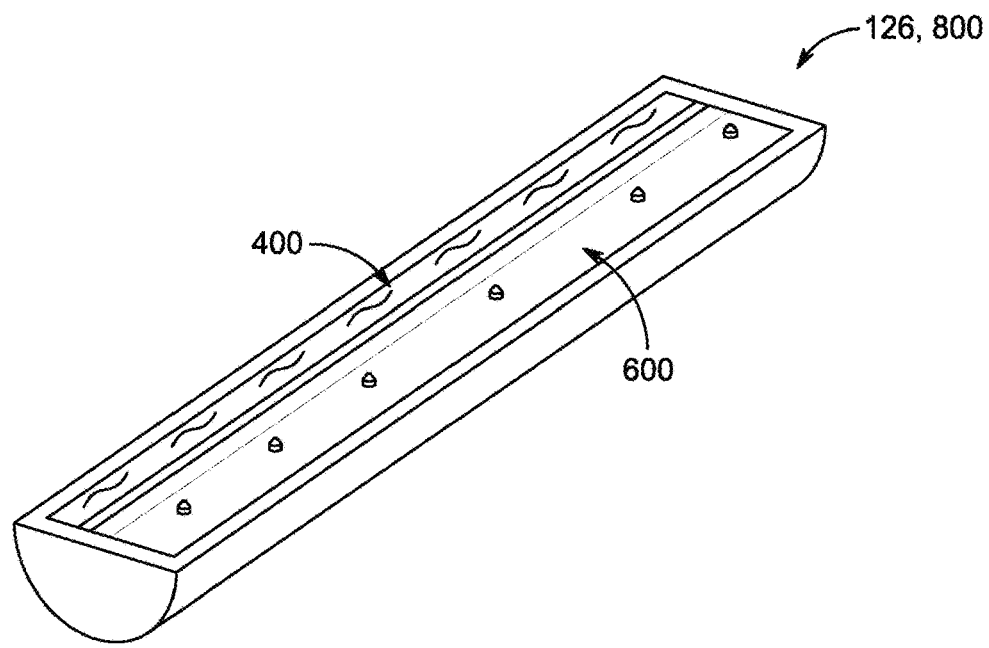
FIG. 8A is an exemplary perspective view diagram of the cleaning device adapted as the compressed air spray device coupled to the electrostatic device, according to certain embodiments.
Figure 8B:
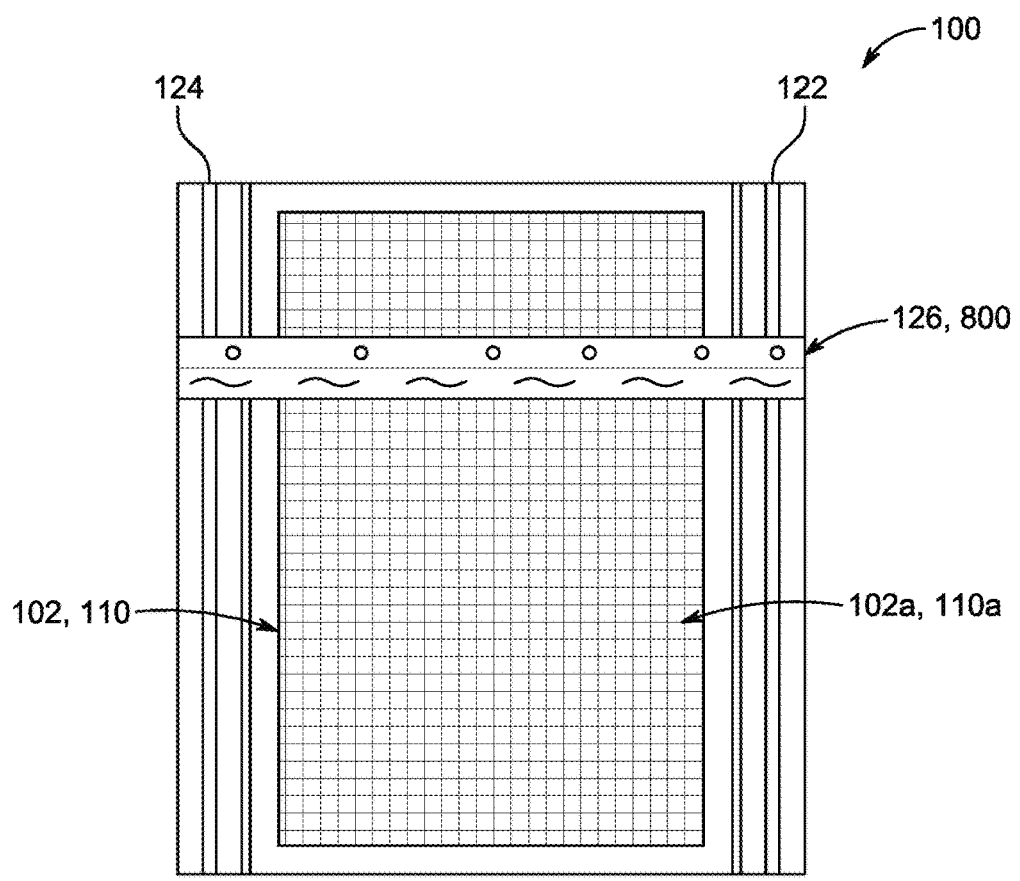
FIG. 8B is an exemplary bottom planar diagram of the cleaning unit of FIG. 8A in operation on the front surface of the photovoltaic array, according to certain embodiments.

In another embodiment, as illustrated in FIG. 8A, the cleaning device 126 is adapted as a cleaning device 800 including the compressed air spray device 600 coupled to the electrostatic device 400. This integration of the compressed air spray device 600 with the electrostatic device 400 makes the cleaning device 800 highly effective for cleaning of the photovoltaic array 102. As illustrated in FIG. 8B, the cleaning device 800, integrating the compressed air spray device 600 and the electrostatic device 400, is connected to the upper track 122 and the lower track 124 of the cleaning unit 120, and configured to move across the breadth of the front surface 110a of each of the plurality of photovoltaic segments 110. Herein, the electrostatic device 400 is configured to loosen particles from the front surface 102a of the photovoltaic array 102 and the compressed air spray device 600 is configured to blow the loosened particles off the front surface 102a of the photovoltaic array 102. The electrostatic device 400, as part of this integrated system, achieves this loosening of particles through the generation of the electrostatic force, as previously described. Once the particles are loosened by the electrostatic device 400, the compressed air spray device 600 blows air at high velocity, directing a stream of compressed air onto the front surface 102a of the photovoltaic array 102. The force of this air stream removes the loosened particles from the front surface 102a, and also ensures that the particles are expelled away from the photovoltaic array 102, preventing them from resettling. This integration of the compressed air spray device 600 with the electrostatic device 400 results in an efficient two-step cleaning operation to enhance the cleaning efficiency, ensuring that the photovoltaic array 102 is not only freed from stuck dust particles but also that these particles are effectively removed therefrom, thereby, preferably, maintaining the functioning and maximum energy efficiency of the photovoltaic array 102.

Figure 9A:
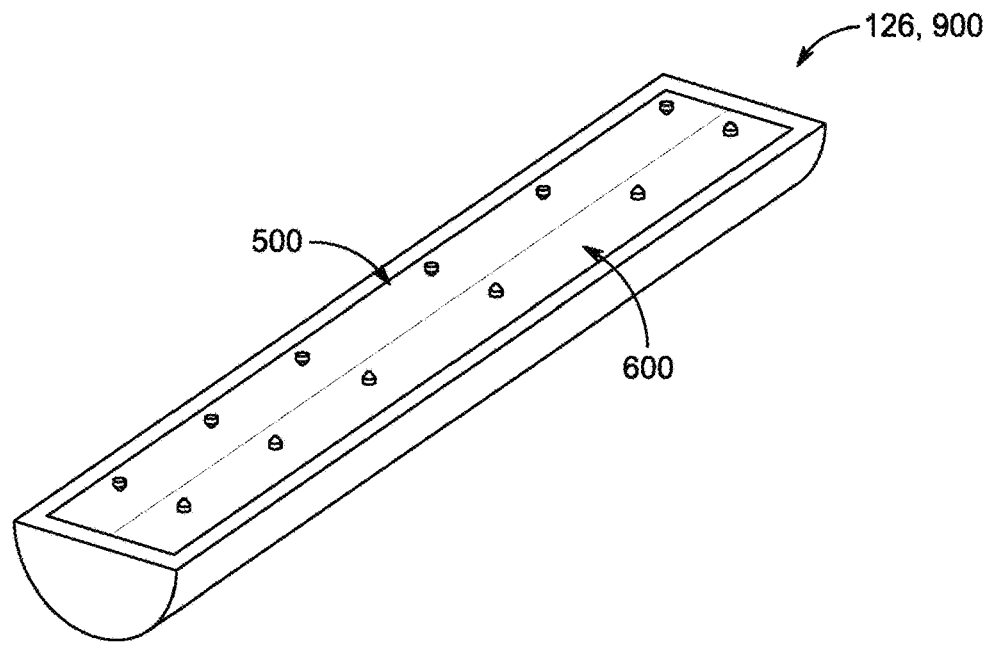
FIG. 9A is an exemplary perspective view diagram of the cleaning device adapted as the compressed air spray device coupled to the vacuum device, according to certain embodiments.
Figure 9B:
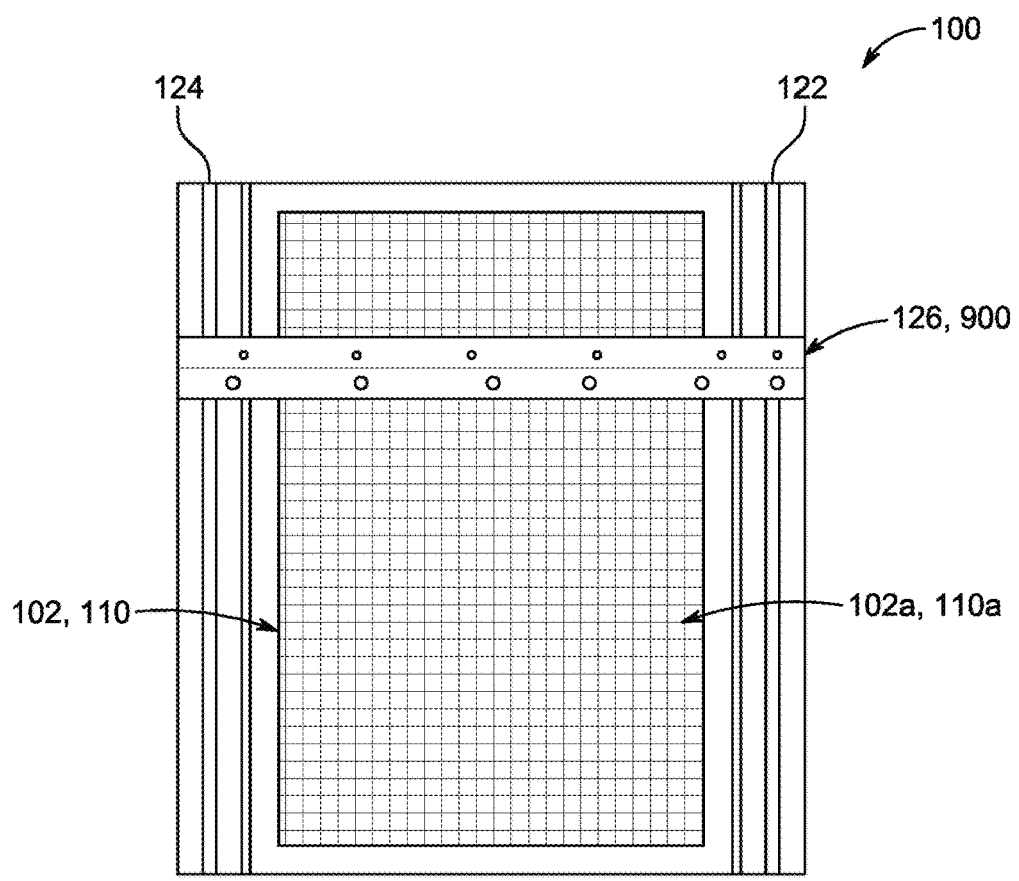
FIG. 9B is an exemplary bottom planar diagram of the cleaning unit of FIG. 9A in operation on the front surface of the photovoltaic array, according to certain embodiments.

In yet another embodiment, as illustrated in FIG. 9A, the cleaning device 126 is adapted as a cleaning device 900 including the compressed air spray device 600 coupled to the vacuum device 500. This integration of the compressed air spray device 600 with the vacuum device 500 makes the cleaning device 900 highly effective for cleaning of the photovoltaic array 102. As illustrated in FIG. 9B, the cleaning device 900, integrating the compressed air spray device 600 and the vacuum device 500, is connected to the upper track 122 and the lower track 124 of the cleaning unit 120, and configured to move across the breadth of the front surface 110a of each of the plurality of photovoltaic segments 110. Herein, the blower 602 of the compressed air spray device 600 is configured to blow particles off the front surface 102a of the photovoltaic array 102, as previously described. Following the action of the compressed air spray device 600, the vacuum device 500 is configured to suck the particles (as previously discussed) loosened by the compressed air spray device 600. This integration of the compressed air spray device 600 with the vacuum device 500 in the cleaning device 900 results in an efficient two-stage cleaning operation, ensuring that the photovoltaic array 102 is effectively cleaned of dust and debris, thereby maintaining its functioning and maximum energy efficiency, preferably.

Figure 10A:
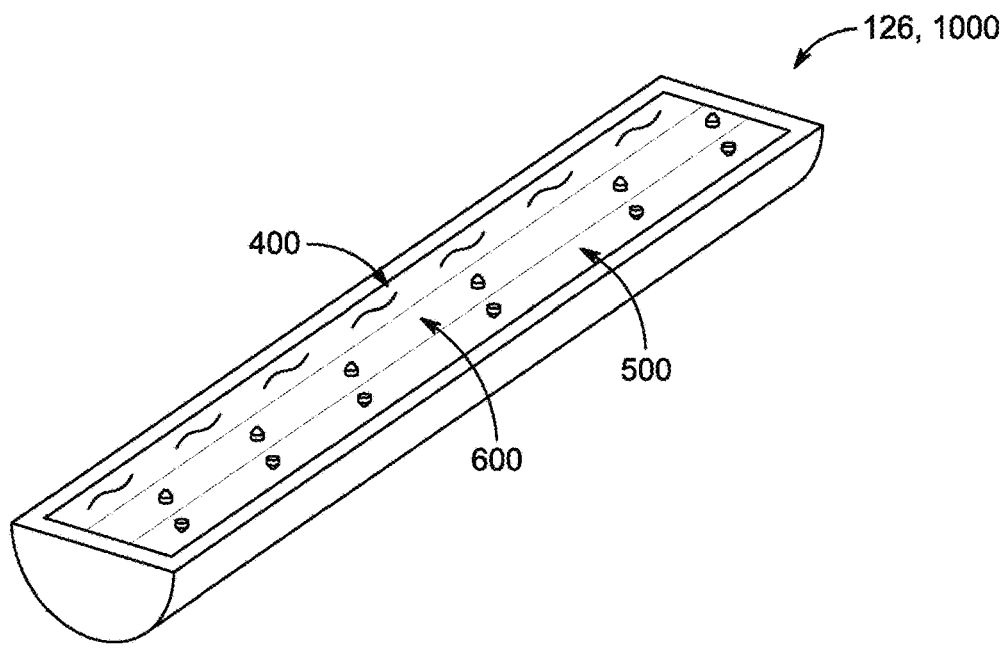
FIG. 10A is an exemplary perspective view diagram of the cleaning device adapted as the compressed air spray device and the vacuum device coupled to the electrostatic device, according to certain embodiments.
Figure 10B:
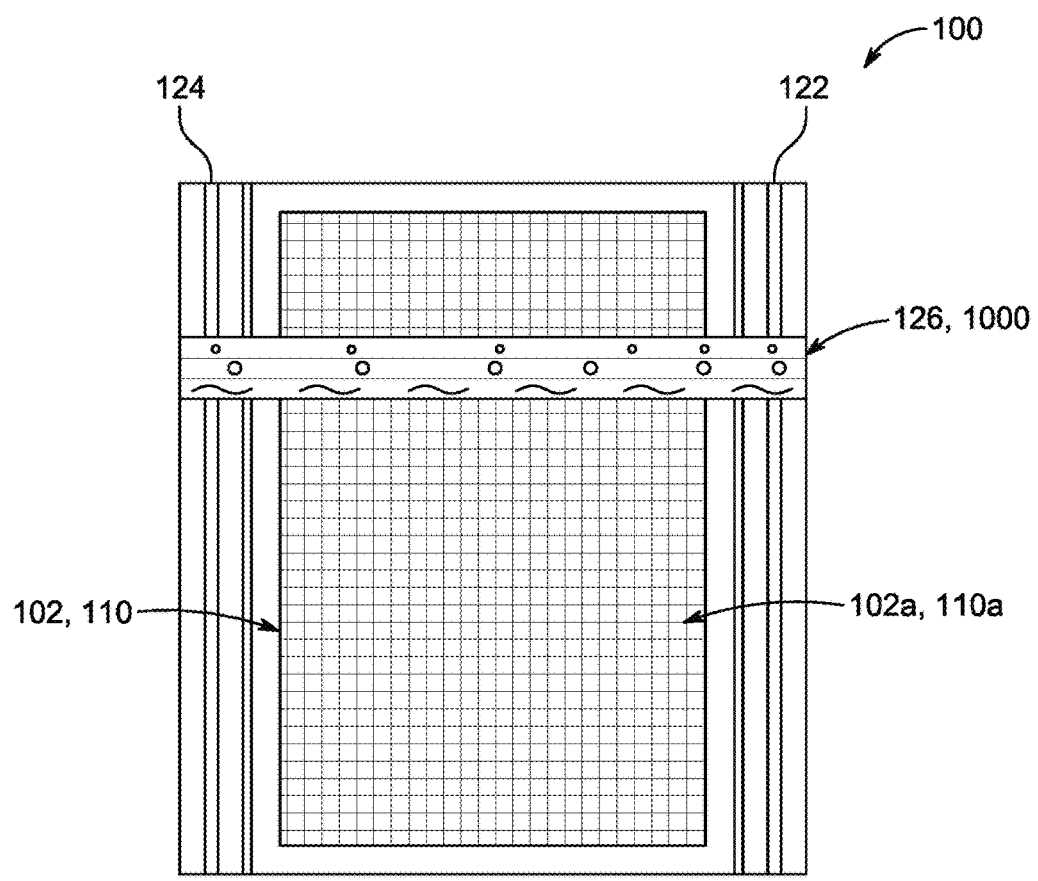
FIG. 10B is an exemplary bottom planar diagram of the cleaning unit of FIG. 10A in operation on the front surface of the photovoltaic array, according to certain embodiments.

In still another embodiment, as illustrated in FIG. 10A, the cleaning device 126 is adapted as a cleaning device 1000 including the compressed air spray device 600 and the vacuum device 500 coupled to the electrostatic device 400. This integration of the compressed air spray device 600 and the vacuum device 500, both coupled to the electrostatic device 400, significantly enhances the cleaning effectiveness for the photovoltaic array 102. As depicted in FIG. 10B, the cleaning device 1000, integrating the compressed air spray device 600, the vacuum device 500, and the electrostatic device 400, is connected to the upper track 122 and the lower track 124 of the cleaning unit 120, and configured to move across the breadth of the front surface 110a of each of the plurality of photovoltaic segments 110. Herein, the electrostatic device 400 initiates the cleaning process, by repelling dust particles away from the front surface 102a, loosening them without requiring physical contact, thereby preparing them for subsequent removal. Once the particles are loosened, the compressed air spray device 600, equipped with the blower 602, blows a high-velocity stream of air onto the front surface 102a to dislodge the loosened particles, clearing them off and preventing them from resettling. Further, the vacuum device 500 sucks up the dislodged particles from the front surface 102a by creating a low-pressure zone that effectively draws in these particles, ensuring their complete removal from the photovoltaic array 102. This integration of the compressed air spray device 600, the vacuum device 500 and the electrostatic device 400 results in an efficient three-stage cleaning operation, ensuring that the photovoltaic array 102 is effectively cleaned of dust and debris, thereby maintaining its functioning and maximum energy efficiency, preferably.

In the present embodiments, the photovoltaic array 102 is configured to supply power to the vacuum device 500 and the compressed air spray device 600. For this purpose, the photovoltaic array 102, which converts sunlight into electrical energy, is electrically connected to the cleaning device 126, adapted either as the vacuum device 500 or the compressed air spray device 600, or combination thereof. The energy generated by the photovoltaic array 102 is utilized to power the vacuum generator 502 in the vacuum device 500, to generate the necessary suction force for removing particles from the panel surfaces, and/or the blower 602 in the compressed air spray device 600, to generate the high-velocity air stream used in the cleaning process. In general, the photovoltaic array 102 may power all functions of the cleaning unit 120, including its drive mechanism as well as the cleaning mechanism(s). This configuration, harnessing the power generated by the photovoltaic array 102 to operate the cleaning mechanisms in the cleaning device 126, makes the cleaning system 100 self-powering. Such capability is particularly advantageous as it reduces the need for external power sources, making the cleaning system 100 more sustainable and cost-effective.

Further, the cleaning system 100 for photovoltaic surfaces incorporates several innovative features that significantly enhance the efficiency and practicality of maintaining the photovoltaic array 102, especially in large-scale installations. Normally, the photovoltaic array 102 is inclined i.e., oriented at an angle ranging from 30 to 45 degrees, depending on geographical location, to maximize sunlight exposure. The photovoltaic segments 110 therein are typically active and produce electricity from early morning (around 7 am to 9 am) until the late afternoon (around 4 pm to 5 pm). Now, to minimize dust accumulation and facilitate easy waterless cleaning, the cleaning system 100 is configured to rotate the photovoltaic array 102 from its original position (first position) to an angle where their active surface (front surface 102a) faces the ground, nearly parallel to it, during non-productive hours (from evening around 4 pm or 5 pm until morning around 8 am or 9 am), based on its programming executed using a controller or the like (as discussed later in the description). For example, if the photovoltaic array 102 is oriented at a 45-degree angle, it may be rotated 135 degrees to make the front surface 102a parallel to the ground. Depending on the angle of the photovoltaic array 102 in the original position, the photovoltaic array 102 may be inclined to at least 105 degrees from the original position. It may be appreciated that the photovoltaic array 102 may be divided into the photovoltaic segments 110 (containing 2, 3, 4, 5, or 6 PV photovoltaic segments 110) coupled together. This segmentation facilitates smooth flipping and evenly distributes the load of the photovoltaic array 102. Further, for present purposes, it may be appreciated that the height of the photovoltaic array 102 may be adjustable (using the support structure 106) to accommodate required height for convenient and smooth flipping. This process helps remove larger dust particles accumulated during the day automatically via gravitational force. For smaller, lighter particles, or those adhering to the surface, the cleaning system 100 employs cleaning processes, including one or a combination of techniques such as electrostatic dust repellant mechanisms, vacuum devices, and compressed air spray devices, as discussed in the preceding paragraphs. These varied cleaning methodologies ensure a thorough cleaning of the photovoltaic array 102, addressing different types of particulate matter effectively.

The cleaning system 100 of the present disclosure offers multiple advantages over existing photovoltaic panel cleaning technologies. Traditional cleaning systems often rely heavily on manual labor or automated systems that use large quantities of water, which is not only costly but also environmentally unsustainable, especially in arid regions. The cleaning system 100, incorporating the rotor 112 to rotate the photovoltaic array 102 for an efficient cleaning positioning, combined with the cleaning unit 120 that includes one or combinations of electrostatic, vacuum, and compressed air mechanisms, ensures a thorough and effective cleaning process. This approach allows for the removal of various types of debris, from fine dust to larger particles, without the need for water. In regions where water scarcity is a concern, the waterless cleaning approach of the present disclosure provides a significant environmental advantage. The cleaning system 100 is also designed to be powered by the photovoltaic array 102 itself, making it a self-sustaining solution. This feature is particularly beneficial as it reduces the operational costs and carbon footprint of the cleaning process, unlike conventional systems that require external power sources.

Figure 11:
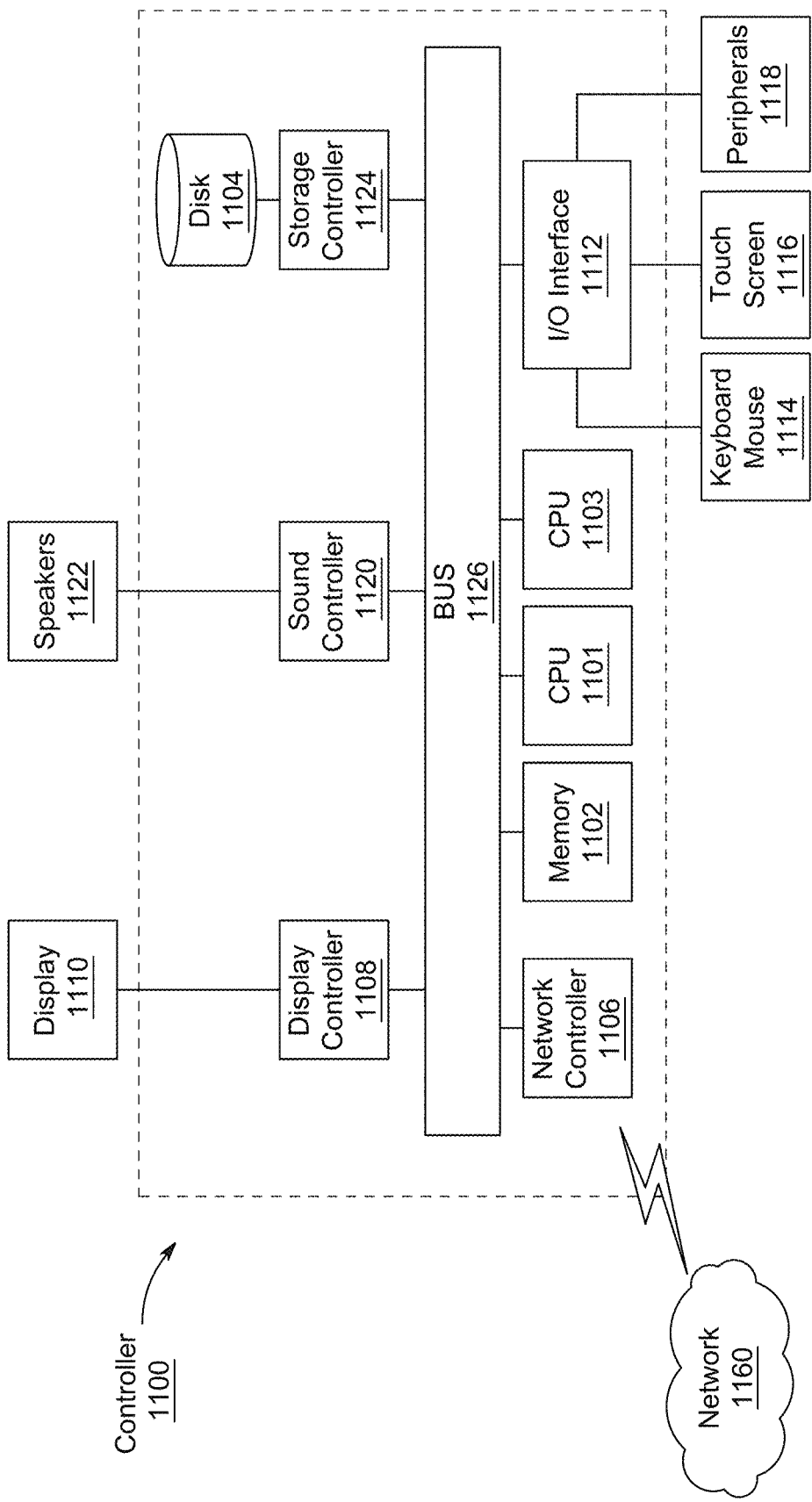
FIG. 11 is an illustration of a non-limiting example of details of computing hardware used in the computing system, according to certain embodiments.

Next, further details of the hardware description of the computing environment according to exemplary embodiments is described with reference to FIG. 11. In FIG. 11, a controller 1100 is described as representative of the controller for the cleaning system 100 in which the controller is a computing device which includes a CPU 1101 which performs the processes described above/below. The process data and instructions may be stored in memory 1102. These processes and instructions may also be stored on a storage medium disk 1104 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1101, 1103 and an operating system such as Microsoft Windows 7, Microsoft Windows 10, Microsoft Windows 11, UNIX, Solaris, LINUX, Apple MAC-OS, and other systems known to those skilled in the art.

The hardware elements in order to achieve the computing device may be realized by various circuitry elements, known to those skilled in the art. For example, CPU 1101 or CPU 1103 may be a Xenon or Core processor from Intel of America or an Opteron processor from AMD of America, or may be other processor types that would be recognized by one of ordinary skill in the art. Alternatively, the CPU 1101, 1103 may be implemented on an FPGA, ASIC, PLD or using discrete logic circuits, as one of ordinary skill in the art would recognize. Further, CPU 1101, 1103 may be implemented as multiple processors cooperatively working in parallel to perform the instructions of the inventive processes described above.

The computing device in FIG. 11 also includes a network controller 1106, such as an Intel Ethernet PRO network interface card from Intel Corporation of America, for interfacing with network 1160. As can be appreciated, the network 1160 can be a public network, such as the Internet, or a private network such as an LAN or WAN network, or any combination thereof and can also include PSTN or ISDN sub-networks. The network 1160 can also be wired, such as an Ethernet network, or can be wireless such as a cellular network including EDGE, 3G, 4G and 5G wireless cellular systems. The wireless network can also be Wi-Fi, Bluetooth, or any other wireless form of communication that is known.

The computing device further includes a display controller 1108, such as a NVIDIA GeForce GTX or Quadro graphics adaptor from NVIDIA Corporation of America for interfacing with display 1110, such as a Hewlett Packard HPL2445w LCD monitor. A general purpose I/O interface 1112 interfaces with a keyboard and/or mouse 1114 as well as a touch screen panel 1116 on or separate from display 1110. General purpose I/O interface also connects to a variety of peripherals 1118 including printers and scanners, such as an OfficeJet or DeskJet from Hewlett Packard.

A sound controller 1120 is also provided in the computing device such as Sound Blaster X-Fi Titanium from Creative, to interface with speakers/microphone 1122 thereby providing sounds and/or music.

The general-purpose storage controller 1124 connects the storage medium disk 1104 with communication bus 1126, which may be an ISA, EISA, VESA, PCI, or similar, for interconnecting all of the components of the computing device. A description of the general features and functionality of the display 1110, keyboard and/or mouse 1114, as well as the display controller 1108, storage controller 1124, network controller 1106, sound controller 1120, and general purpose I/O interface 1112 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 12.

Figure 12:
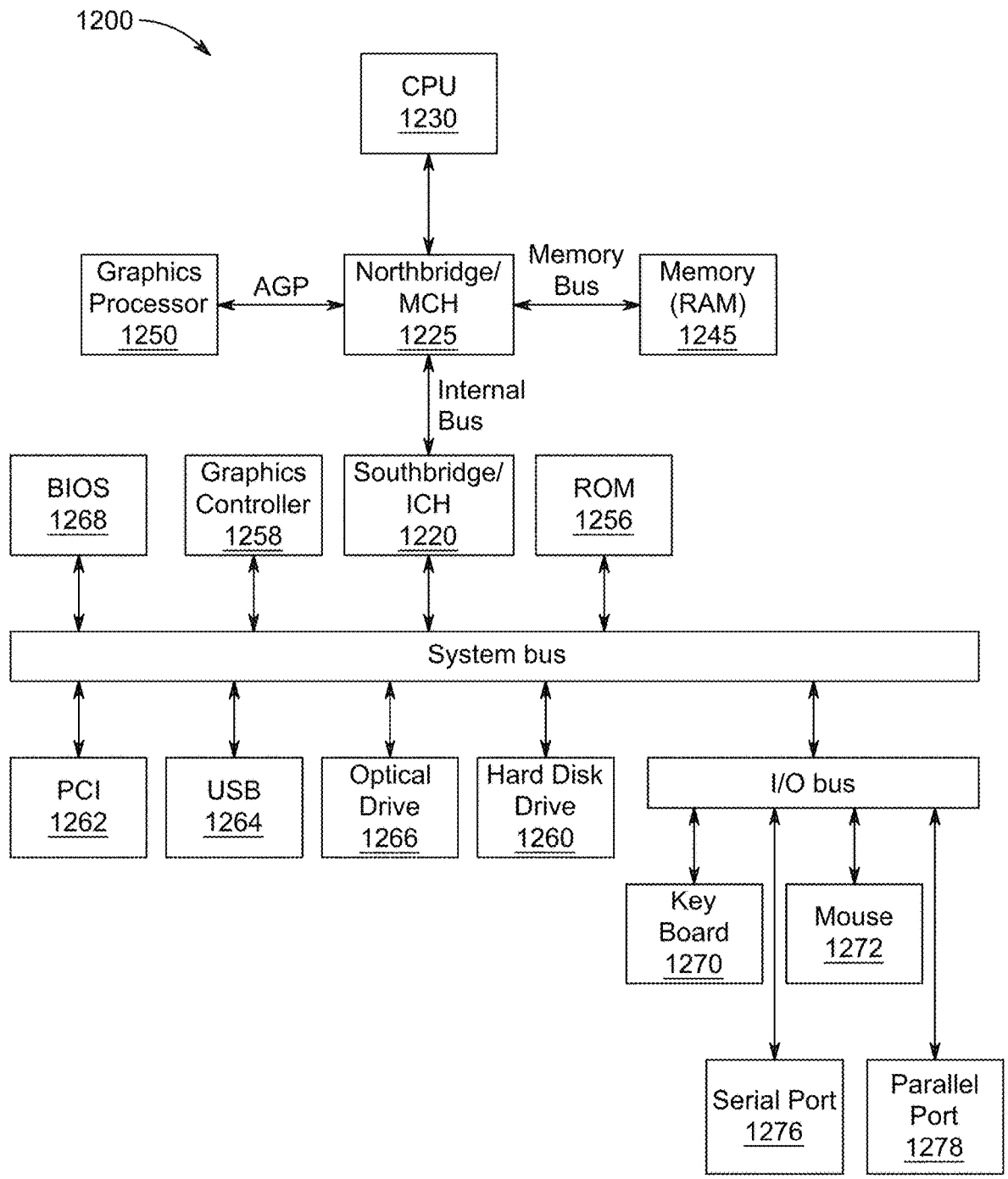
FIG. 12 is an exemplary schematic diagram of a data processing system used within the computing system, according to certain embodiments.

FIG. 12 shows a schematic diagram of a data processing system, according to certain embodiments, for performing the functions of the exemplary embodiments. The data processing system is an example of a computer in which code or instructions implementing the processes of the illustrative embodiments may be located.

In FIG. 12, data processing system 1200 employs a hub architecture including a north bridge and memory controller hub (NB/MCH) 1225 and a south bridge and input/output (I/O) controller hub (SB/ICH) 1220. The central processing unit (CPU) 1230 is connected to NB/MCH 1225. The NB/MCH 1225 also connects to the memory 1245 via a memory bus, and connects to the graphics processor 1250 via an accelerated graphics port (AGP). The NB/MCH 1225 also connects to the SB/ICH 1220 via an internal bus (e.g., a unified media interface or a direct media interface). The CPU Processing unit 1230 may contain one or more processors and even may be implemented using one or more heterogeneous processor systems.

Figure 13:
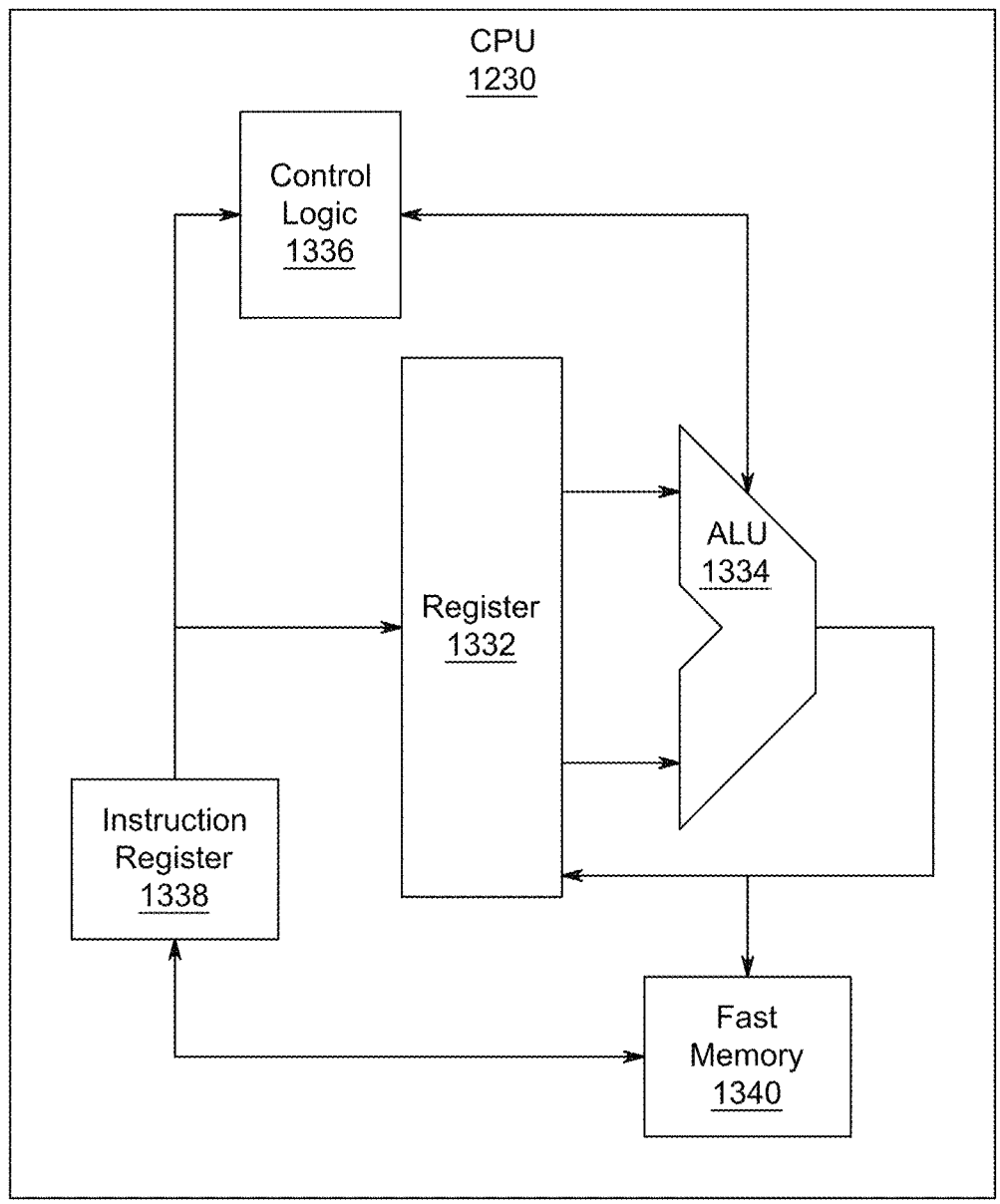
FIG. 13 is an exemplary schematic diagram of a processor used with the computing system, according to certain embodiments.

For example, FIG. 13 shows one implementation of CPU 1230. In one implementation, the instruction register 1338 retrieves instructions from the fast memory 1340. At least part of these instructions are fetched from the instruction register 1338 by the control logic 1336 and interpreted according to the instruction set architecture of the CPU 1230. Part of the instructions can also be directed to the register 1332. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using the arithmetic logic unit (ALU) 1334 that loads values from the register 1332 and performs logical and mathematical operations on the loaded values according to the instructions. The results from these operations can be feedback into the register and/or stored in the fast memory 1340. According to certain implementations, the instruction set architecture of the CPU 1230 can use a reduced instruction set architecture, a complex instruction set architecture, a vector processor architecture, a very large instruction word architecture. Furthermore, the CPU 1230 can be based on the Von Neuman model or the Harvard model. The CPU 1230 can be a digital signal processor, an FPGA, an ASIC, a PLA, a PLD, or a CPLD. Further, the CPU 1230 can include but not limited to be an x86 processor by Intel or by AMD; an ARM processor, a Power architecture processor by, e.g., IBM; a SPARC architecture processor by Sun Microsystems or by Oracle; or other known CPU architecture.

Referring again to FIG. 12, the data processing system 1200 can include that the SB/ICH 1220 is coupled through a system bus to an I/O Bus, a read only memory (ROM) 1256, universal serial bus (USB) port 1264, a flash binary input/output system (BIOS) 1268, and a graphics controller 1258. PCI/PCIe devices can also be coupled to SB/ICH 1288 through a PCI bus 1262.

The PCI devices may include, for example, Ethernet adapters, add-in cards, and PC cards for notebook computers. The Hard disk drive 1260 and CD-ROM 1266 can use, for example, an integrated drive electronics (IDE) or serial advanced technology attachment (SATA) interface. In one implementation the I/O bus can include a super I/O (SIO) device.

Further, the hard disk drive (HDD) 1260 and optical drive 1266 can also be coupled to the SB/ICH 1220 through a system bus. In one implementation, a keyboard 1270, a mouse 1272, a parallel port 1278, and a serial port 1276 can be connected to the system bus through the I/O bus. Other peripherals and devices that can be connected to the SB/ICH 1220 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 14:
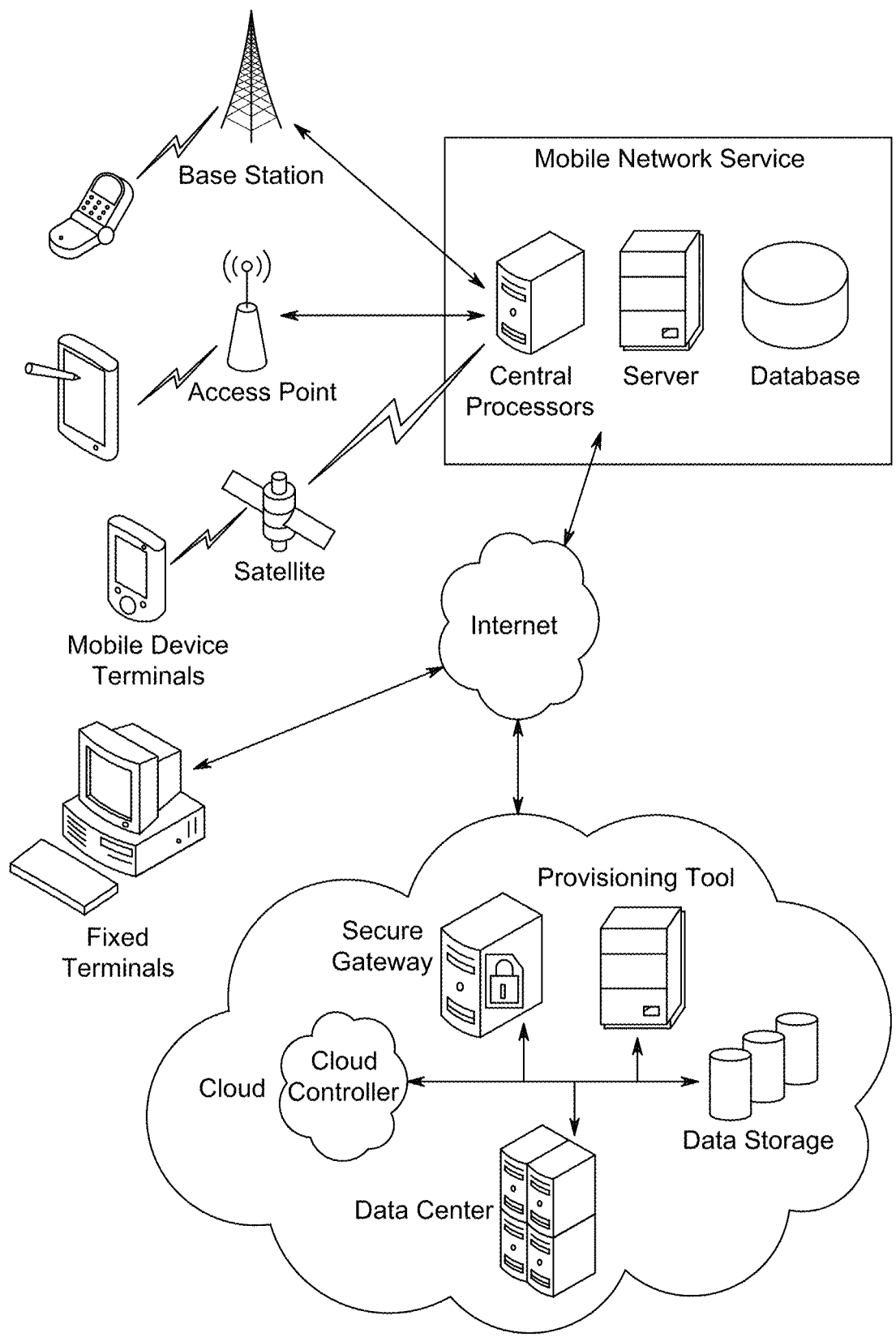
FIG. 14 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 14, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A photovoltaic array cleaning system, comprising:
   a photovoltaic array mounted on a top surface of a base, wherein the photovoltaic array comprises a plurality of photovoltaic segments arranged in parallel;
   a rotor arranged along a central axis of a bottom surface of the base such that the rotor is aligned with a central axis of each photovoltaic segment of the plurality of photovoltaic segments;
   wherein the rotor is configured to turn the base between a first position and a second position, wherein in the second position, a front surface of the photovoltaic array is at an angle of at least 105 degrees from the first position;
   a motor configured to drive the rotor;
   a support structure comprising a set of supporting legs, wherein the base is mounted on the support structure;

a cleaning unit configured to remove particles from the front surface of the photovoltaic array, wherein the cleaning unit comprises:

an upper track, a lower track, and a cleaning device, wherein the upper track is parallel to a top edge of the photovoltaic array, the lower track is parallel to a bottom edge of the photovoltaic array, and both the upper track and the lower track are coplanar with the photovoltaic array;

wherein the cleaning device has a top end and a bottom end, the top end connected to the upper track and the bottom end connected to the lower track;

wherein the cleaning device is encased in a half cylindrical box with an opening configured to expose the cleaning device;

wherein in the first position of the photovoltaic array, the cleaning device is positioned in at least one of a first edge and a second edge of the photovoltaic array;

wherein the cleaning device is
- a compressed air spray device configured to blow particles on the front surface of the photovoltaic array, wherein the compressed air spray device comprises a plurality of nozzles spaced to distribute compressed air across the breadth of the front surface of the photovoltaic array and the upper and lower tracks;

wherein the cleaning unit is further configured to function when the photovoltaic array is in the second position; and wherein the photovoltaic array is configured to supply power to the vacuum device and the compressed air spray device.

2. The cleaning system of claim 1, wherein the vacuum device is configured to move across a breadth of a front surface of each of the plurality of photovoltaic segments.

3. The cleaning system of claim 1, wherein the compressed air spray device comprises a blower with a top end connected to the upper track and a bottom end connected to the lower track of the cleaning unit.

4. The cleaning system of claim 3, wherein the blower of the compressed air spray device is configured to move across a breadth of a front surface of each of the plurality of photovoltaic segments.

5. The cleaning system of claim 1, wherein the rotor is configured to turn the photovoltaic array about the central axis of the bottom surface of the base.

6. The cleaning system of claim 1, wherein a first end of each of the set of supporting legs of the support structure is connected to the central axis of the bottom surface of the base.

* * * * *